(12) United States Patent
Yasumoto et al.

(10) Patent No.: US 9,036,336 B2
(45) Date of Patent: May 19, 2015

(54) IN-VEHICLE DISPLAY APPARATUS

(71) Applicant: Alpine Electronics, Inc., Tokyo (JP)

(72) Inventors: Takashi Yasumoto, Iwaki (JP); Kazunari Kato, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 182 days.

(21) Appl. No.: 13/951,877

(22) Filed: Jul. 26, 2013

(65) Prior Publication Data

US 2014/0063718 A1 Mar. 6, 2014

(30) Foreign Application Priority Data

Sep. 4, 2012 (JP) ................................. 2012-194251
May 16, 2013 (JP) ................................. 2013-104218

(51) Int. Cl.
| | |
|---|---|
| *H04N 5/64* | (2006.01) |
| *B60Q 1/00* | (2006.01) |
| *G06F 1/16* | (2006.01) |
| *H05K 5/00* | (2006.01) |
| *B60K 35/00* | (2006.01) |
| *B60K 37/02* | (2006.01) |
| *G01D 11/30* | (2006.01) |

(52) U.S. Cl.
CPC .............. *H05K 5/0017* (2013.01); *B60K 35/00* (2013.01); *B60K 37/02* (2013.01); *B60K 2350/1072* (2013.01); *B60K 2350/206* (2013.01); *B60K 2350/2091* (2013.01); *B60K 2350/406* (2013.01); *B60K 2350/962* (2013.01); *G01D 11/305* (2013.01)

(58) Field of Classification Search
USPC ........... 361/679.01, 679.02, 679.04; 348/837; 345/1.3; 340/425.5
See application file for complete search history.

(56) References Cited

U.S. PATENT DOCUMENTS

| | | | | |
|---|---|---|---|---|
| 5,768,096 | A * | 6/1998 | Williams et al. ......... | 361/679.04 |
| 6,583,773 | B1 * | 6/2003 | Nogami et al. .................... | 345/7 |
| 6,844,865 | B2 * | 1/2005 | Stasko ........................... | 345/1.3 |
| 6,859,219 | B1 * | 2/2005 | Sall ................................ | 345/1.1 |

(Continued)

FOREIGN PATENT DOCUMENTS

| | | |
|---|---|---|
| DE | 4240465 | 6/1994 |
| DE | 102004024596 | 3/2005 |

(Continued)

OTHER PUBLICATIONS

Extended Search Report for EP13182438 dated Jan. 23, 2014, 8 pgs.

*Primary Examiner* — Adrian S Wilson
(74) *Attorney, Agent, or Firm* — Brinks Gilson & Lione

(57) ABSTRACT

An in-vehicle display apparatus includes a display panel including a rectangular display screen; a pair of semicircular decorative rings (frames) obtained by dividing an annular member into two parts along a line extending in a lateral direction of the display screen; and a driving mechanism that drives the decorative rings to reciprocate toward and away from each other in a longitudinal direction of the display screen. The decorative rings are rotatable around axes extending in the lateral direction of the display screen. The driving mechanism moves the decorative rings while the decorative rings are in front of the display panel and in parallel positions in relation to the display screen. The decorative rings are rotated on sides of the display panel in a longitudinal direction of the display panel and stored in storage spaces.

19 Claims, 18 Drawing Sheets

(56) References Cited

U.S. PATENT DOCUMENTS

| | | |
|---|---|---|
| 7,382,234 B2 | 6/2008 | Yokota et al. |
| 8,473,853 B2 * | 6/2013 | Gage .............................. 715/761 |
| 2006/0092001 A1 | 5/2006 | Yokota et al. |
| 2007/0153456 A1 * | 7/2007 | Lin ................................ 361/681 |
| 2007/0247798 A1 * | 10/2007 | Scott, II ........................ 361/683 |
| 2007/0285343 A1 * | 12/2007 | Han et al. ....................... 345/1.3 |
| 2008/0024288 A1 | 1/2008 | Kageyama et al. |
| 2013/0186324 A1 * | 7/2013 | Kato ............................ 116/28 R |
| 2013/0307757 A1 * | 11/2013 | Yasumoto ....................... 345/32 |
| 2014/0292828 A1 * | 10/2014 | Yasumoto et al. ............ 345/690 |

FOREIGN PATENT DOCUMENTS

| | | |
|---|---|---|
| DE | 102005052007 | 2/2012 |
| JP | 4648681 | 12/2010 |

* cited by examiner

IN-VEHICLE DISPLAY APPARATUS

RELATED APPLICATIONS

The present application claims priority to Japanese Patent Application Number 2012-194251, filed Sep. 4, 2012, and Japanese Patent Application Number 2013-104218, filed May 16, 2013, the entirety of which are hereby incorporated by reference.

BACKGROUND

1. Field of the Invention

The present invention relates to an in-vehicle display apparatus mounted on an instrument panel in a vehicle interior.

2. Description of the Related Art

As an example of an in-vehicle display apparatus mounted on an instrument panel in a vehicle interior, an apparatus has been developed that can display vehicle-related information such as travel speed or engine speed on a display screen of a display panel and that can selectively display vehicle related information by moving an annular frame, displayed in front of the display screen, in the right-left direction. For example, in an in-vehicle display apparatus described in U.S. Pat. No. 7,382,234, an annular frame is driven to reciprocate between a first display area and a second display area by a driving unit such as a motor. A specific type of vehicle-related information, such as an image of a tachometer, is constantly displayed in a circular area surrounded by the annular frame. Other types of vehicle-related information, such as images of a fuel gauge and an inlet/exhaust gas temperature gauge, are selectively displayed in other areas.

In such an in-vehicle display apparatus, when the display panel is turned on as a result of turning an engine (or accessories) on, an initial screen is displayed, that is, an image of a tachometer is displayed in a first display area of the display screen and other types of vehicle-related information, such as images of a fuel gauge and a coolant temperature gauge, are displayed in other areas. Here, the frame stops at the first display area so as to surround the outer periphery of the image of the tachometer. From this state, when the driving unit is operated to move the frame from the first display area to the second display area, an image of the tachometer is displayed in the second display area and another type of vehicle-related information, such as an image of an engine oil gauge instead of a fuel gauge, is displayed in another area.

However, in the above-described existing in-vehicle display apparatus, when the engine (or accessories) is off and the display panel is off, only the annular frame that is in a stationary state appears in front of the display screen that no longer displays images and has darkened. Since this frame is visually perceived as floating over the dark screen, the frame prevents the design of the display apparatus from being stylish.

SUMMARY

The present invention has been accomplished in view of the related art, and an object of embodiments of the present invention is to provide an in-vehicle display apparatus that can hide a frame that is movable in front of a display panel while light of a screen is off.

In order to achieve the above object, an in-vehicle display apparatus according to an embodiment of the invention includes a display panel including an elongated (e.g., rectangular) display screen; a frame positioned in front of the display panel, the frame surrounding at least part of an outer periphery of an image displayed on the display panel; and a driving mechanism that drives the frame to reciprocate in a longitudinal direction of the display screen. At least part of the frame forms a rotatable frame that is rotatable around an axis extending in a lateral direction of the display screen. The driving mechanism moves the frame while the frame is in front of the display panel and in a parallel position in relation to the display screen. The rotatable frame is rotated on a side of the display panel in a longitudinal direction of the display panel and stored in a storage space.

In the in-vehicle display apparatus having the above-described configuration, the frame that surrounds at least part of an outer periphery of the displayed image is movable in front of the display panel. When the engine (or accessories) is off and the display panel is off, at least part of the frame (rotatable frame) is rotated on a side of the display panel in the longitudinal direction of the display panel and stored in a storage space. Thus, the frame can be retracted from the front of the display screen that no longer displays images and has darkened, thereby realizing a stylish design called the "dead front" design, in which the presence of the display panel is not perceived. Furthermore, since at least part of the frame is stored in the storage space while being in a rotated position, the size of the entire in-vehicle display apparatus in the longitudinal direction can be prevented from increasing.

In the in-vehicle display apparatus having the above-described configuration, the driving mechanism includes a motor, a screw shaft, which is driven to rotate by the motor, and an actuator, which linearly moves in the longitudinal direction of the display screen as the screw shaft rotates, and the actuator includes a guide mechanism that rotatably and pivotally supports the rotatable frame and that regulates an angle at which the rotatable frame rotates.

Thus, the rotatable frame can be smoothly operated.

Here, the guide mechanism may be a guide rail including a horizontal portion, which extends parallel to the screw shaft, and a bent portion, which is continuous with an end of the horizontal portion, and the rotatable frame may include a guide protrusion that slides over the guide rail, and the guide protrusion may be pressed against the guide rail by an urging force of a spring member. This configuration is preferable because the guide mechanism can be made simply with this configuration.

Alternatively, the driving mechanism may include a motor, a timing belt, which is driven by the motor to rotate between a pair of pulleys, and an actuator, which is joined to the timing belt and moves along a guide shaft extending in a longitudinal direction of the display screen. The actuator may rotatably and pivotally support the rotatable frame. A guide mechanism may be provided to regulate an angle at which the rotatable frame rotates.

In this case, the guide mechanism may be a guide groove including a horizontal portion, which extends parallel to the guide shaft, and a bent portion, which is continuous with an end of the horizontal portion, and the rotatable frame may include a guide protrusion that fits into the guide groove. This configuration is preferable because the guide mechanism can be made simply and the rotatable frame can be operated smoothly with this configuration.

In the in-vehicle display apparatus having the above-described configuration, the frame may be an integrated annular member. However, it is preferable that the frame include a pair of semicircular decorative rings obtained by dividing an annular member into two parts along a line extending in the lateral direction of the display screen, the decorative rings being individually rotatable around axes extending in the lateral direction of the display screen; that the driving mechanism drive the pair of decorative rings to reciprocate toward and away from each other in the longitudinal direction of the display screen; and that the driving mechanism drive the decorative rings to rotate on both sides of the display panel in the longitudinal direction and store the decorative rings in storage spaces. In the in-vehicle display apparatus having the above-described configuration, by moving the pair of decorative rings obtained by dividing an annular member into two parts toward and away from each other in front of the display panel, vehicle related information can be stereoscopically and selectively displayed, for example, a specific type of vehicle related information displayed on the display screen may be surrounded by the annularly joined decorative rings, or two types of vehicle related information displayed at separate positions of the display screen are individually and partially surrounded by the decorative rings each forming a semicircular shape. When the engine (or accessories) is off and the display panel is off, the decorative rings are rotated on both sides of the display panel in the longitudinal direction of the display panel and stored in storage spaces. Thus, the decorative rings can be retracted from the display screen that no longer displays images and has darkened, thereby realizing a stylish design called the "dead front" design, in which the presence of the display panel is not perceived. Furthermore, since the decorative rings are stored in the storage spaces while being in bent positions, the size of the in-vehicle display apparatus in the longitudinal direction can be prevented from increasing.

In this case, it is preferable that the driving mechanism that drives the decorative rings to operate include a motor, a pair of screw shafts, which are driven to rotate by the motor, and a pair of actuators, which linearly move in the longitudinal direction of the display screen as the screw shafts rotate; that the decorative rings be rotatably and pivotally supported by the actuators; and that a guide mechanism be provided to regulate angles at which the decorative rings rotate. This configuration is preferable because the pair of decorative rings can be operated smoothly.

In this case, the pair of screw shafts may be individually driven to rotate by motors. However, the pair of screw shafts may be joined together via a gear in a center portion of the display panel in the longitudinal direction of the display panel so as to rotate in opposite directions. This configuration is preferable because the pair of decorative rings can be driven to operate by a single motor.

In this case, the guide mechanism that regulates the angles at which the decorative rings rotate may include a guide rail including a horizontal portion, which extends parallel to the screw shafts, and a bent portion, which is continuous with an end of the horizontal portion, and each of the decorative rings may include a guide protrusion that slides over the guide rail, and the guide protrusion may be pressed against the guide rail by an urging force of a spring member. This configuration is preferable because the guide mechanism can be made simply.

Alternatively, in the in-vehicle display apparatus having the above-described configuration, the frame may include a pair of semicircular members obtained by dividing an annular member into two parts along a line extending in the lateral direction of the display screen, one of the semicircular members may be a movable frame that moves while being in a parallel position in relation to the display screen, and the other semicircular member may be the rotatable frame rotatably and pivotally supported by the movable frame, the driving mechanism may drive the movable frame and the rotatable frame to reciprocate in the longitudinal direction of the display screen while the movable frame and the rotatable frame are annularly joined, and the rotatable frame may be rotated on a side of the display panel in the longitudinal direction of the display panel and stored in the storage space. In the in-vehicle display apparatus having the above-described configuration, by moving the movable frame and the rotatable frame in front of the display panel, a specific type of vehicle related information displayed on the display screen can be stereoscopically and selectively displayed by being surrounded by the annularly joined movable and rotatable frames. When the engine (or accessories) is off and the display panel is off, the rotatable frame is rotated on a side of the display panel in the longitudinal direction of the display panel and stored in a storage space. Thus, the frame can be retracted from the display screen that no longer displays images and has darkened, thereby realizing a stylish design called the "dead front" design, in which the presence of the display panel is not perceived.

In this case, the driving mechanism that drives the frames (the movable frame and the rotatable frame) may include a motor, a timing belt, which is driven by the motor to rotate, and an actuator, which is joined to the timing belt and moves along a guide shaft extending in a longitudinal direction of the display screen; the movable frame may be securely fixed to the actuator; the rotatable frame may be rotatably joined to the actuator; and a guide mechanism may be provided to regulate an angle at which the rotatable frame rotates. This configuration is preferable because the movable frame and the rotatable frame can be operated smoothly.

In this case, the guide mechanism that regulates the angle at which the rotatable frame rotates may be a guide groove including a horizontal portion, which extends parallel to the guide shaft, and a bent portion, which is continuous with an end of the horizontal portion, and the rotatable frame may include an engagement protrusion that fits into the guide groove. This configuration is preferable because the guide mechanism can be made simply.

In the in-vehicle display apparatus having the above configuration, the frame that surrounds at least part of an outer periphery of the displayed image is movable in front of the display panel. When the engine is off and the display panel is off, at least part of the frame is rotated on a side of the display panel in the longitudinal direction of the display panel and stored in a storage space. Thus, the frame can be retracted from the front of the display screen that no longer displays images and has darkened, thereby realizing a stylish design called the "dead front" design, in which the presence of the display panel is not perceived. Furthermore, since at least part of the frame is stored in the storage space while being in a rotated state, the size of the in-vehicle display apparatus in the longitudinal direction can be prevented from increasing.

DETAILED DESCRIPTION OF THE PREFERRED EMBODIMENTS

Figure 1:
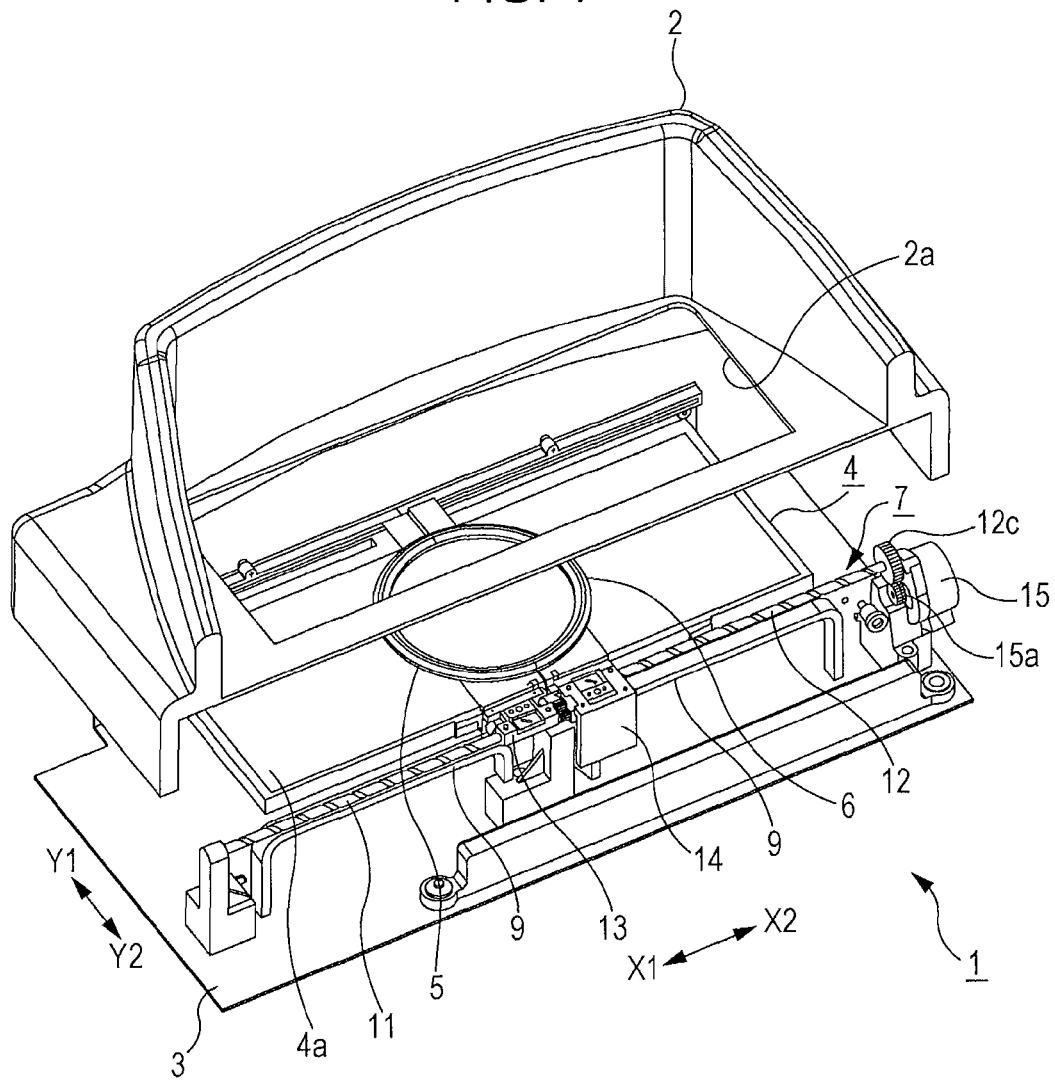
FIG. 1 is a perspective view of an in-vehicle display apparatus according to a first embodiment of the present invention and a panel cover.

Referring now to the drawings, embodiments of the present invention will be described. A first embodiment of the present invention will be described referring to FIG. 1 to FIG. 11E. As illustrated in FIG. 1, an in-vehicle display apparatus 1 according to the first embodiment is mounted on an instrument panel positioned in front of a driver's seat in an interior of a vehicle. The in-vehicle display apparatus 1 is covered by a panel cover 2 having an elongated (e.g., rectangular) opening 2a. The in-vehicle display apparatus 1 mainly includes a base board 3, which is attached to an installation portion of the vehicle, a rectangular display panel 4, which is fixed to the base board 3 and for which a component such as an LCD or an organic EL is employed, a pair of decorative rings 5 and 6, which serve as frames, and a driving mechanism 7, which drives the decorative rings 5 and 6. A display screen 4a of the display panel 4 is visually perceived through the opening 2a of the panel cover 2. Various types of information related to the conditions of the vehicle are displayed on the display screen 4a, such as travel speed, engine speed, the remaining amount of fuel, the remaining battery life, the remaining amount of engine oil, and navigation information.

Figure 2:
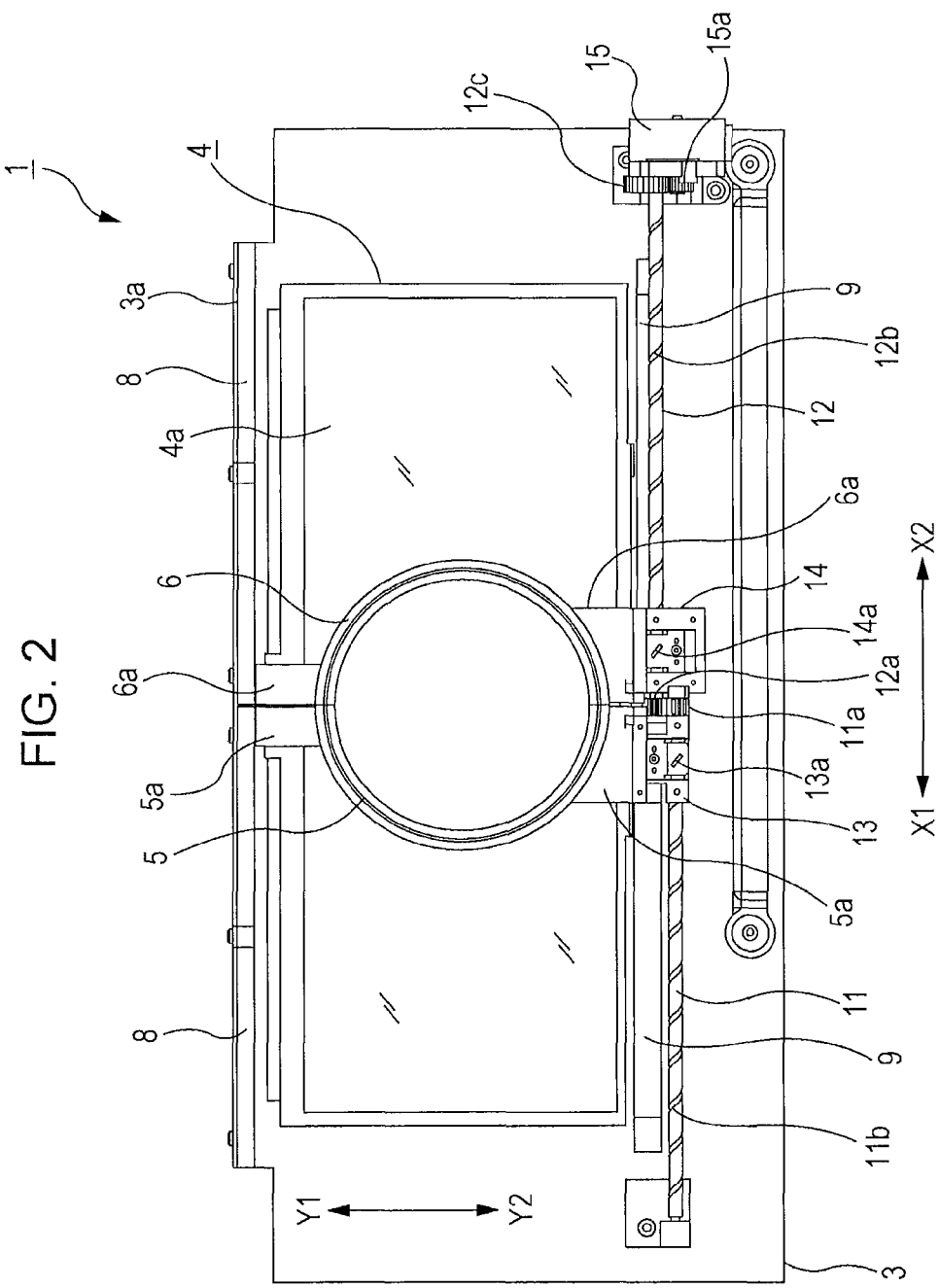
FIG. 2 is a front view of the in-vehicle display apparatus illustrated in FIG. 1.
Figure 4:
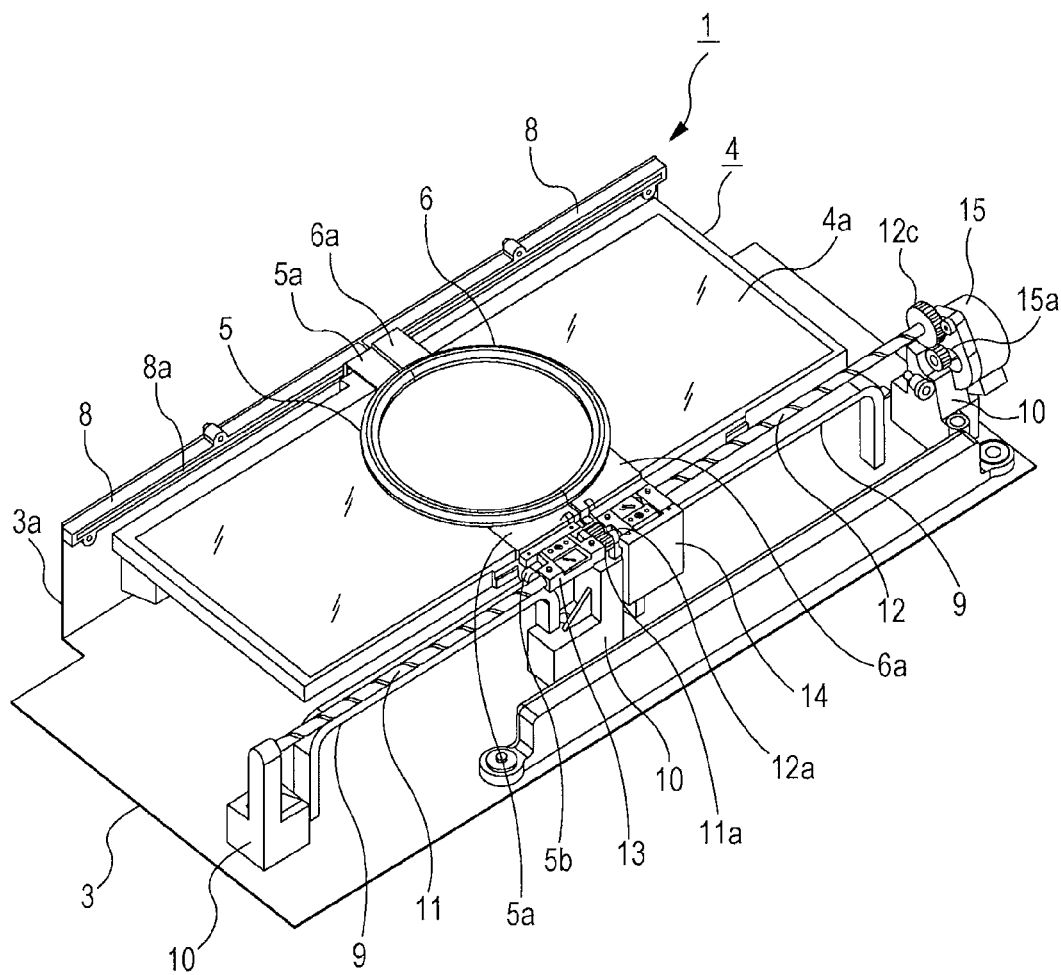
FIG. 4 is a perspective view of the in-vehicle display apparatus illustrated in FIG. 1.

As illustrated in FIG. 2 and FIG. 4, the base board 3 has an erect support wall 3a, to which a pair of guide members 8 are fixed. The guide members 8 each have a guide groove 8a, which linearly extends along a long side of the display panel 4. A pair of guide rails 9 are fixed to the base board 3. The pair of guide members 8 and the pair of guide rails 9 are disposed parallel to each other with the display panel 4 interposed therebetween. The guide rails 9 each include a horizontal portion 9a, arcuate portions 9b, and bent portions 9c. The horizontal portion 9a extends in the longitudinal direction (X1-X2 direction) of the display screen 4a, and the bent portions 9c extend from both ends of the horizontal portion 9a via the arcuate portions 9b in a direction orthogonal to the horizontal portion 9a. The lower ends of the bent portions 9c are fixed to the base board 3.

Three support stands 10 are mounted on the base board 3 so as to be aligned along the guide rails 9. A first screw shaft 11 is rotatably supported by left and center support stands 10 and a second screw shaft 12 is rotatably supported by center and right support stands 10. A gear 11a is securely fixed to a right end portion of the first screw shaft 11 and a gear 12a is securely fixed to a left end portion of the second screw shaft 12. These gears 11a and 12a mesh together in a center portion in the longitudinal direction of the display screen 4a. An actuator 13 is fitted around the first screw shaft 11, and an engagement protrusion 13a of the actuator 13 is engaged in a helical groove 11b of the first screw shaft 11. Similarly, an actuator 14 is fitted around the second screw shaft 12, and an engagement protrusion 14a of the actuator 14 is engaged in a helical groove 12b of the second screw shaft 12. A motor 15 is attached to the right support stand 10. A gear 15a, which is securely fixed to an output shaft of the motor 15, meshes with a gear 12c, which is securely fixed to a right end portion of the second screw shaft 12. Thus, when the motor 15 rotates forward or backward, the first and second screw shafts 11 and 12 rotate in opposite directions and consequently, the actuators 13 and 14 linearly move in the axial directions of the corresponding screw shafts 11 and 12. A detection switch 16 is mounted on the center support stand 10. Starting points of the decorative rings 5 and 6 are detected on the basis of output signals from the detection switch 16. The detection switch 16 is positioned within a range in which the actuator 14 is movable. When the actuator 14 moves to a center portion of the display screen 4a along the second screw shaft 12, the detection switch 16 is turned on and outputs a switch signal.

The pair of decorative rings 5 and 6 are semicircular components obtained by dividing one annular member into two parts along a line extending in a lateral direction (Y1-Y2 direction) of the display screen 4a. The decorative ring 5 on the left has a C shape and the decorative ring 6 on the right has a reverse C shape. The decorative ring 5 has swing pieces 5a and the decorative ring 6 has swing pieces 6a. These swing pieces 5a and 6a are L shaped and protrude toward long sides of the display panel 4. One of the swing pieces 5a and one of the swing pieces 6a are slidably and rotatably inserted into the guide grooves 8a of the corresponding guide members 8. The other swing piece 5a and the other swing piece 6a are rotatably and pivotally supported by the corresponding actuators 13 and 14, respectively. These swing pieces 5a and 6a have guide protrusions 5b and 6b, respectively. Although not illustrated, a torsion coil spring (spring member) is interposed between each swing piece 5a or 6a and the corresponding actuator 13 or 14 and each guide protrusion 5b or 6b is slidably pressed against the corresponding guide rail 9 by an urging force of the torsion coil spring.

Thus, when the first and second screw shafts 11 and 12 are driven to rotate in opposite directions by the motor 15 and thus the actuators 13 and 14 linearly move in the axial direction (X1-X2 direction) of the corresponding screw shafts 11 and 12, the guide protrusions 5b and 6b of the swing pieces 5a and 6a pivotally supported by the actuators 13 and 14 slide over the guide rails 9. In accordance with the positions of the guide protrusions 5b and 6b with respect to the guide rails 9 during sliding, the positions of the decorative rings 5 and 6 are changed. Specifically, when the guide protrusions 5b and 6b slide over the horizontal portions 9a of the guide rails 9, the decorative rings 5 and 6 move within an area under the opening 2a of the panel cover 2 in the right-left direction while being in a parallel position in relation to the display screen 4a. When the guide protrusions 5b and 6b slide over the arcuate portions 9b of the guide rails 9 toward the bent portions 9c, the decorative rings 5 and 6 rotate downward approximately 45 degrees and are stored in storage spaces S on both sides of the display screen 4a while being in inclined positions. The above-mentioned driving mechanism 7 includes components such as the motor 15 and the actuators 13 and 14. In the first embodiment, both decorative rings 5 and 6 are used as frames. The entireties of the decorative rings 5 and 6 including the swing pieces 5a and 6a form rotatable frames that are rotatable around axes extending in the lateral direction of the display screen 4a.

Figure 8:
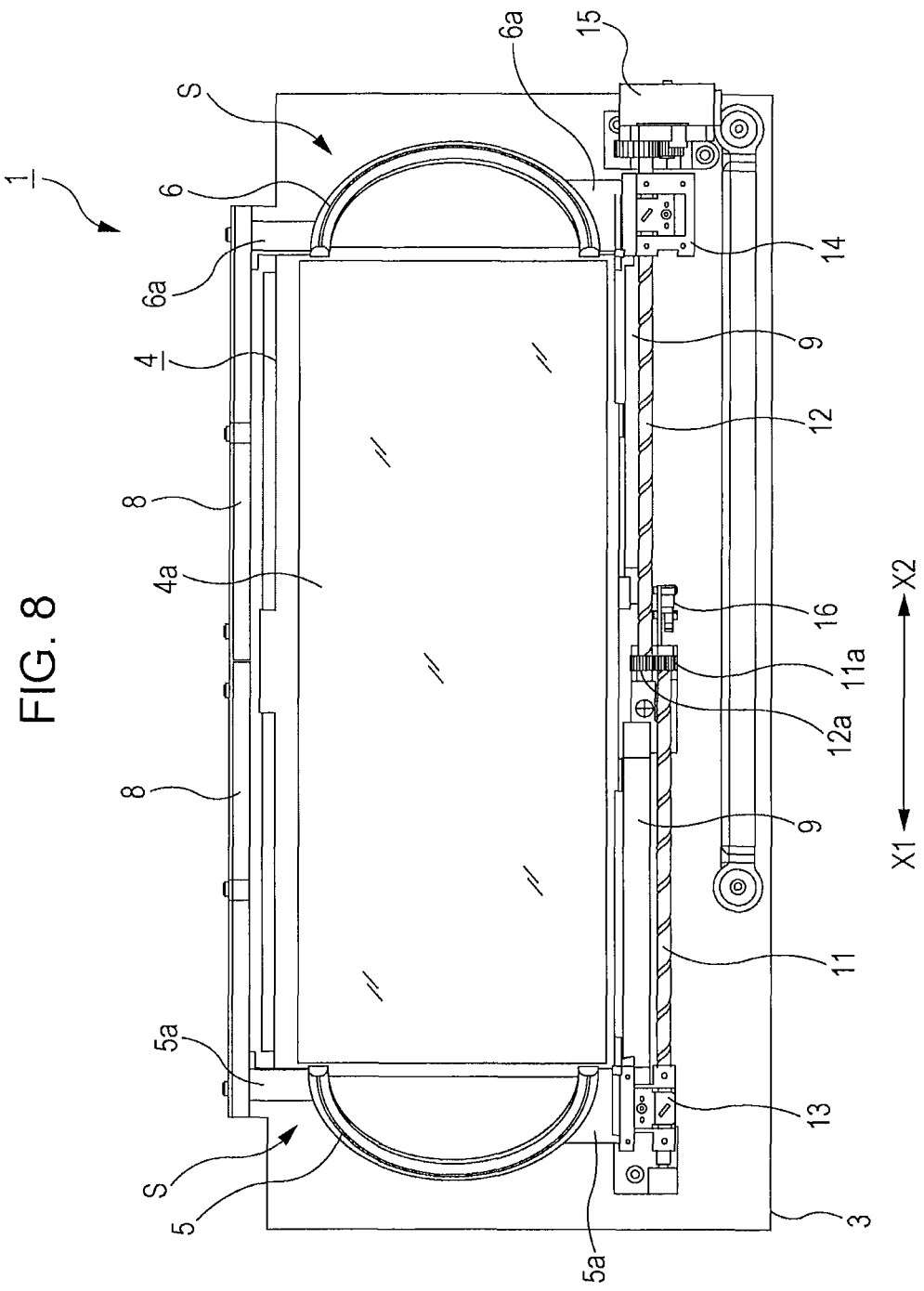
FIG. 8 is a front view of the decorative rings in a state of being stored in storage spaces.
Figure 9:
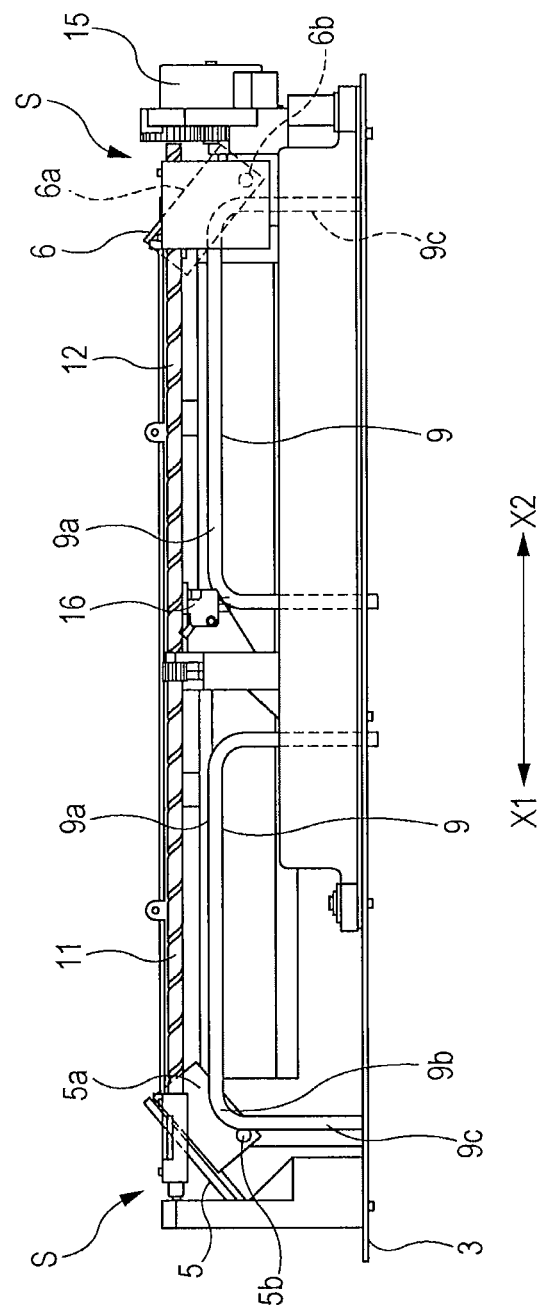
FIG. 9 is a bottom view of the decorative rings in the same state as in FIG. 8.
Figure 10:
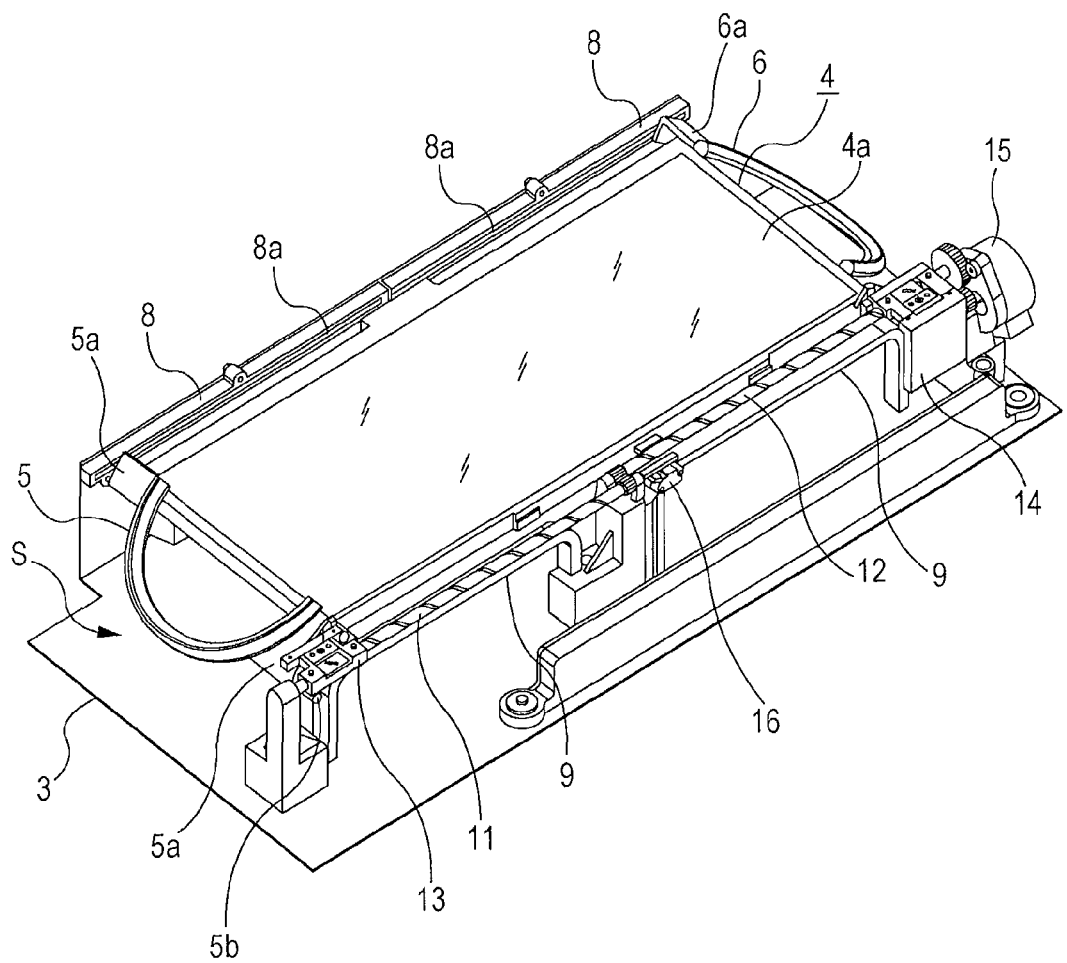
FIG. 10 is a perspective view of the decorative rings in the same state as in FIG. 8.
Figure 11:
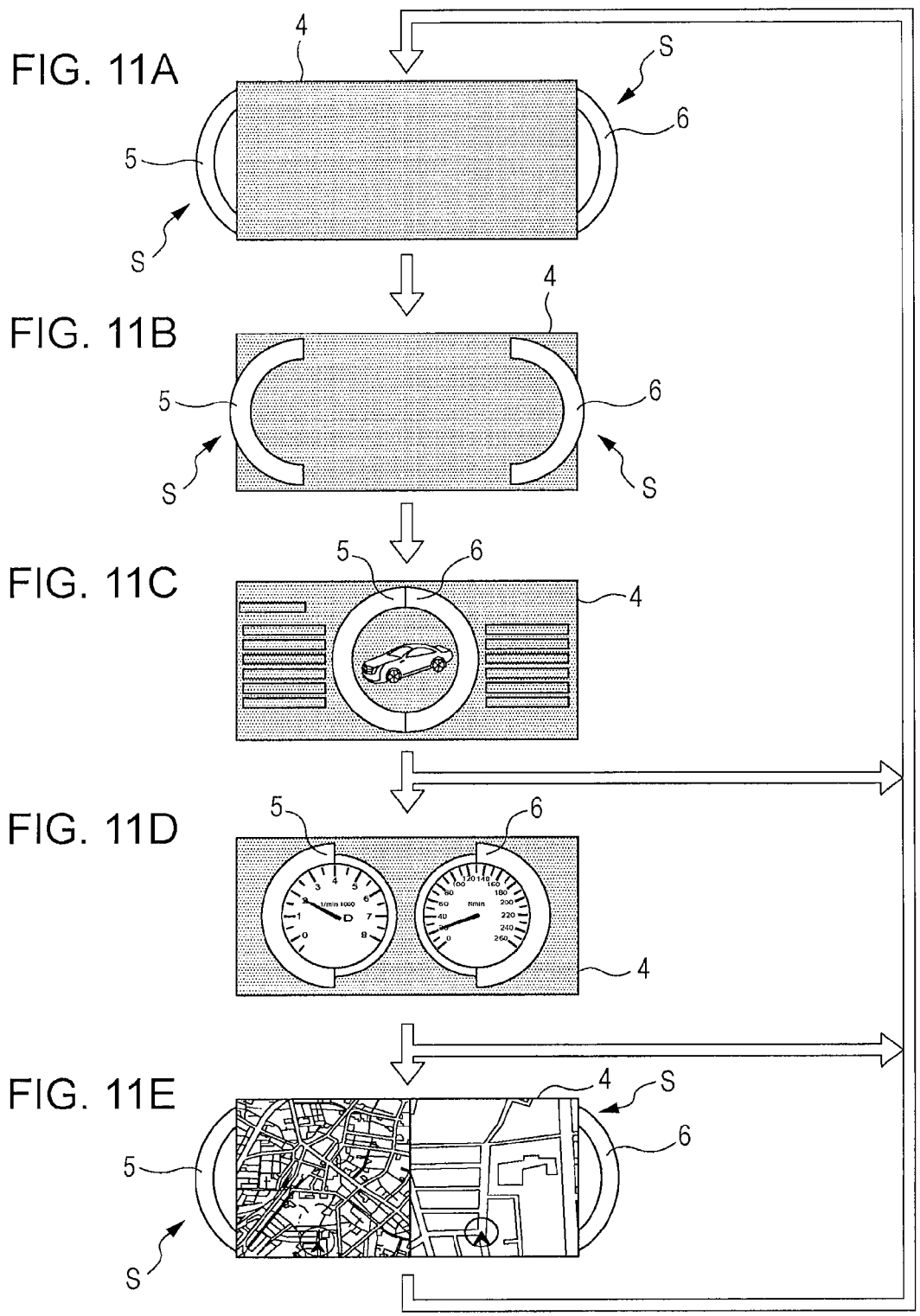
FIGS. 11A to 11E illustrate relationships between the positions to which the decorative rings move and image information displayed on the display panel.
Figure 12:
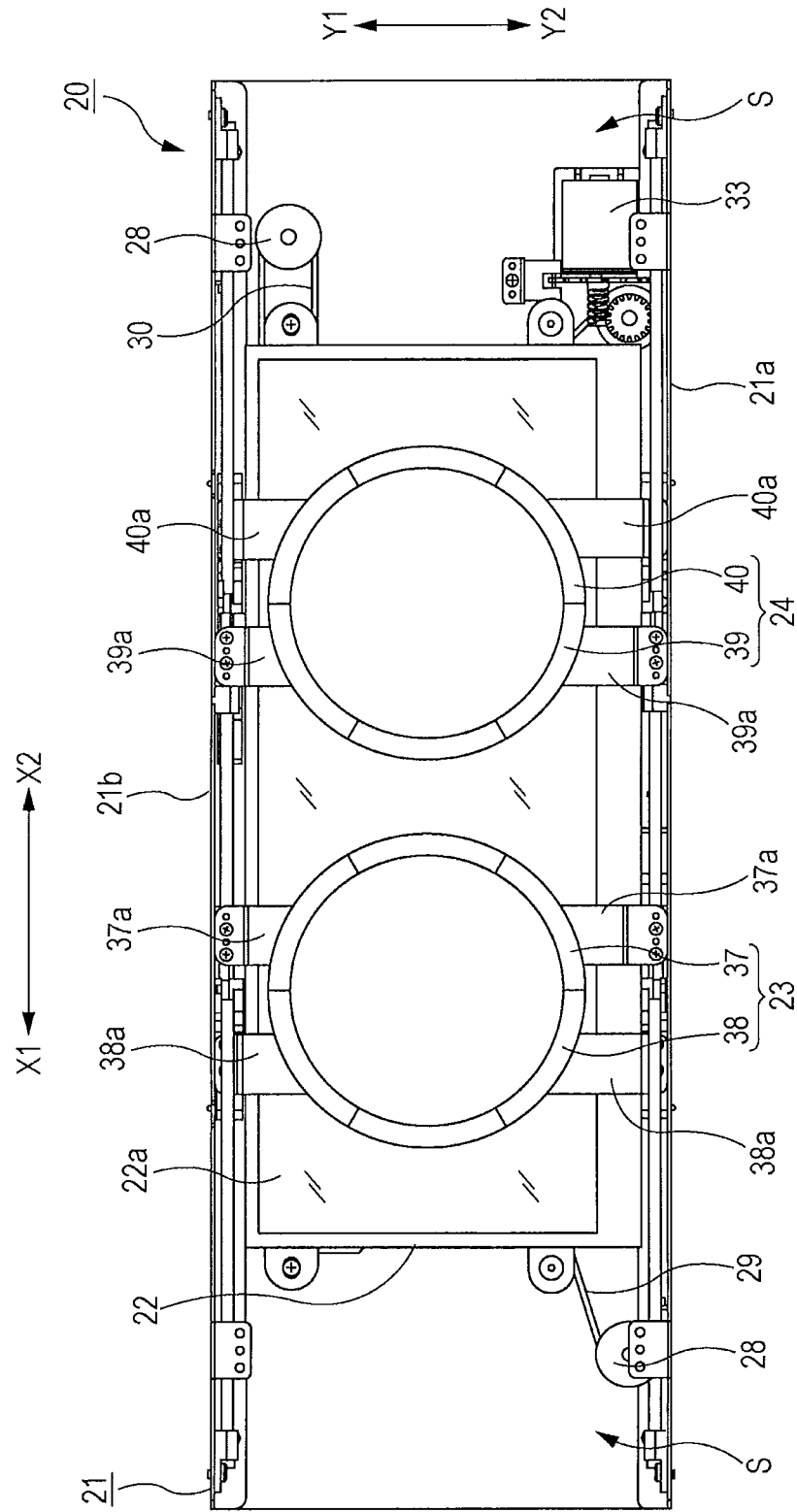
FIG. 12 is a front view of an in-vehicle display apparatus according to a second embodiment of the invention.
Figure 13:
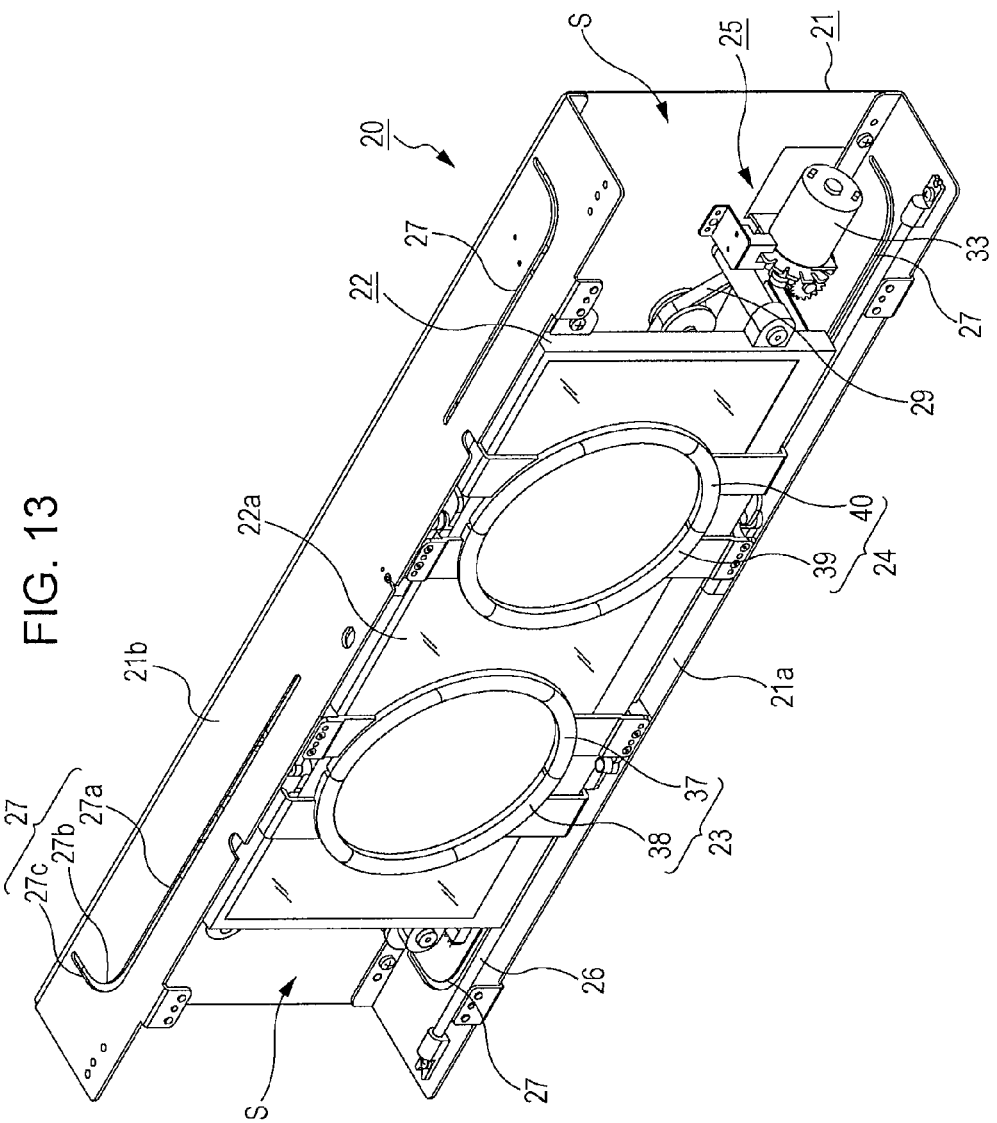
FIG. 13 is a perspective view of the in-vehicle display apparatus illustrated in FIG. 12.

Referring now to FIGS. 11A to 11E, an operation of the in-vehicle display apparatus 1 having the above-described configuration will be described. When the engine (or accessories) is off, the pair of decorative rings 5 and 6 are retracted from the display screen 4a and are stored in the storage spaces S on both right and left sides of the display panel 4, as illustrated in FIG. 11A. Thus, the "dead front" design, in which the presence of the display panel 4 is not perceived until the power is turned on, is realized. In this case, as illustrated in FIG. 8 to FIG. 10, the decorative rings 5 and 6 are stored in the storage spaces S while being in the inclined positions, in which the outer sides of the decorative rings 5 and 6 are inclined downward, as a result of the guide protrusions 5b and 6b coming into contact with the upper end portions of the bent portions 9c of the guide rails 9. Thus, the dimensions of the storage spaces S in the right-left direction (X1-X2 direction) can be reduced and, accordingly, the size of the entire in-vehicle display apparatus 1 in the longitudinal direction can be reduced.

Figure 5:
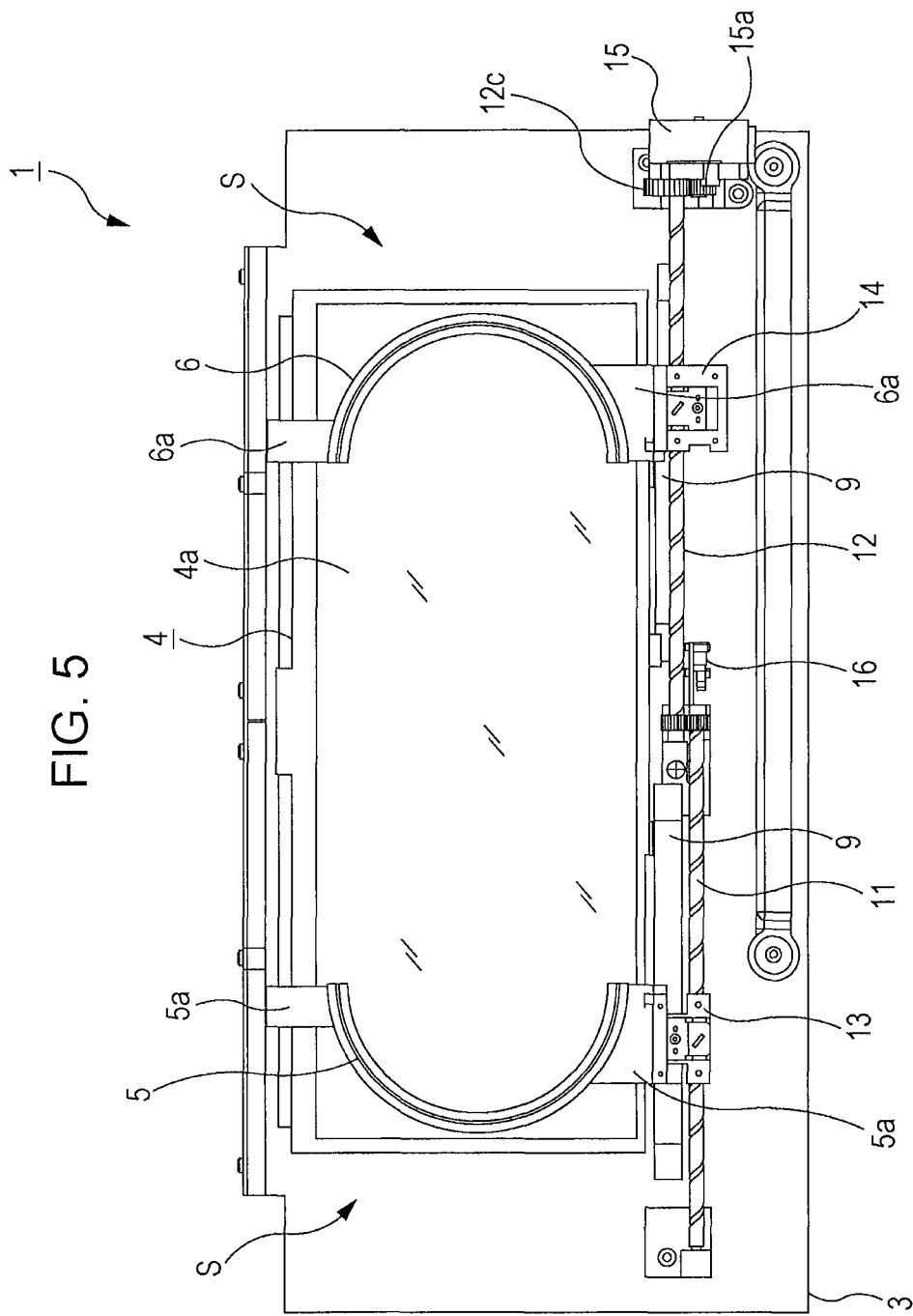
FIG. 5 is a front view of decorative rings of the in-vehicle display apparatus that have been moved to separate positions.
Figure 6:
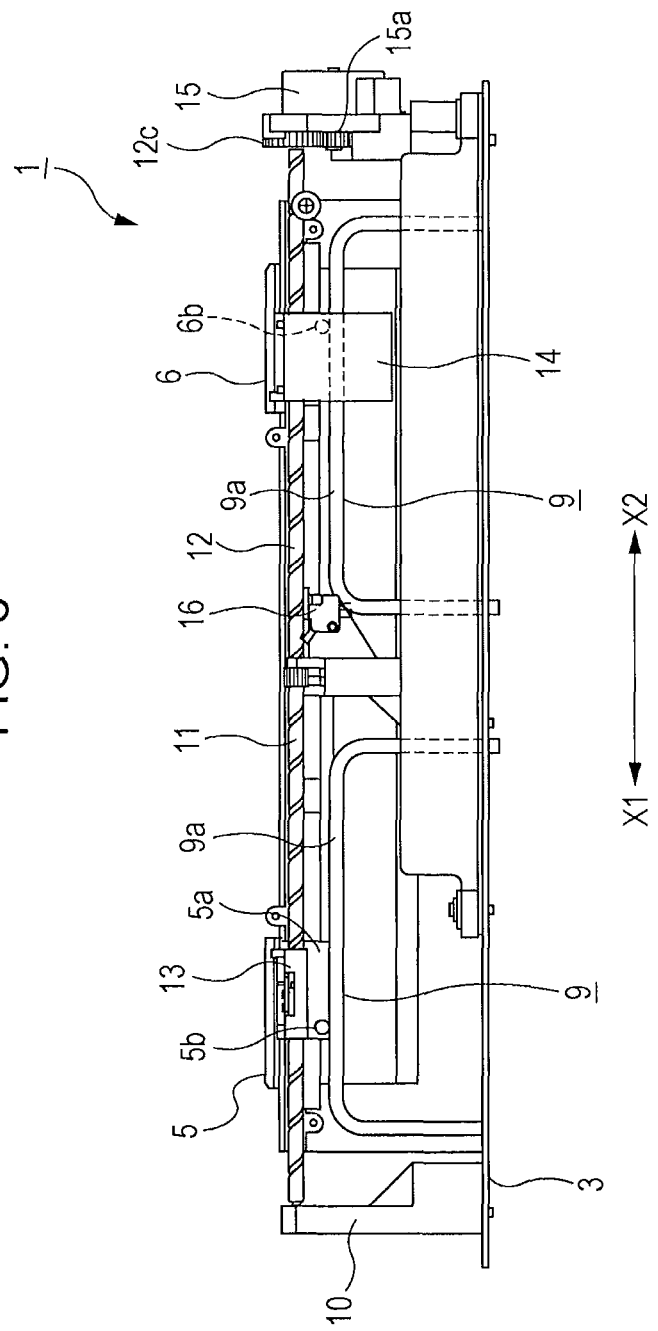
FIG. 6 is a bottom view of the decorative rings in the same state as in FIG. 5.
Figure 7:
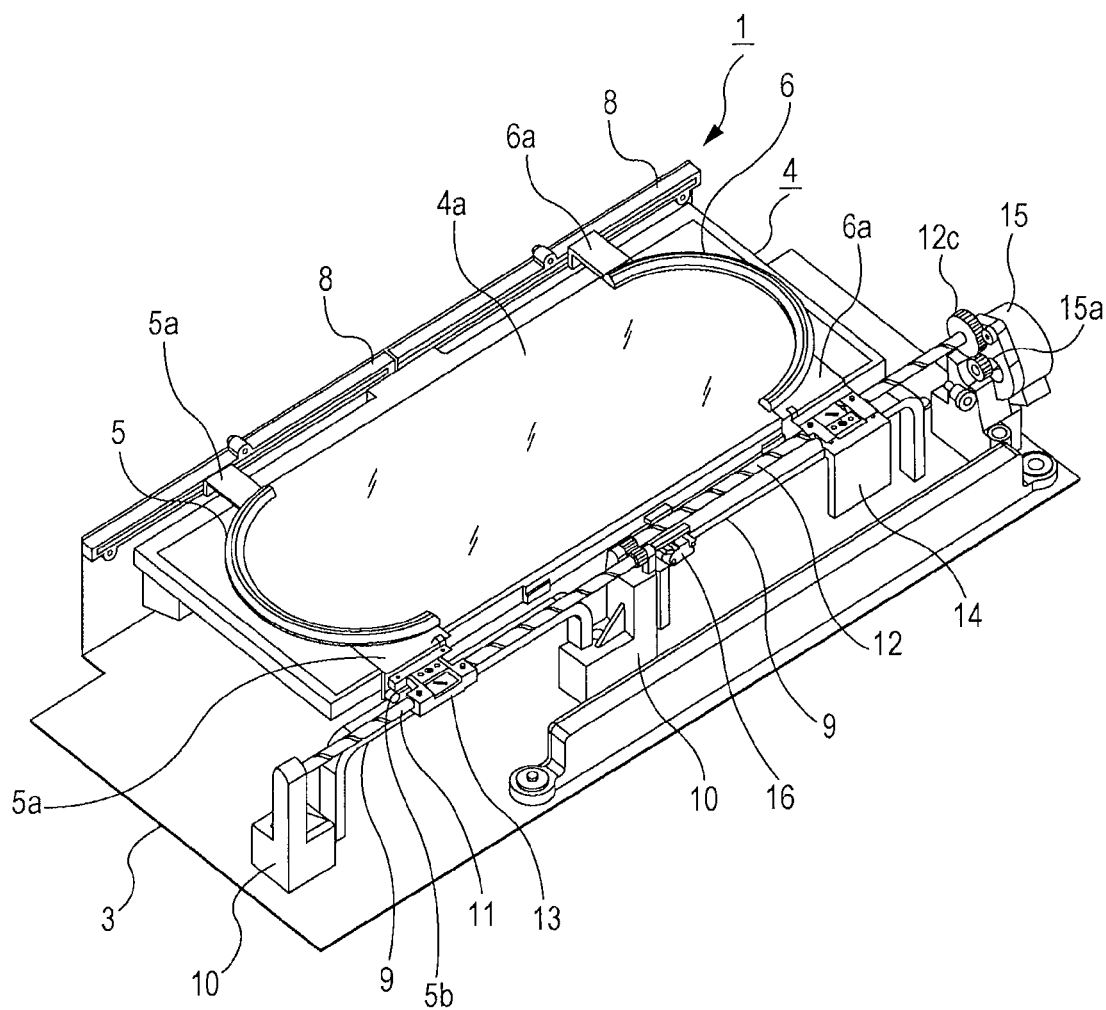
FIG. 7 is a perspective view of the decorative rings in the same state as in FIG. 5.

From this state, when the engine (or accessories) is turned on and the in-vehicle display apparatus 1 is turned on, first, the motor 15 starts rotating forward or backward and then the first and second screw shafts 11 and 12 start rotating in opposite directions. Thus, the actuators 13 and 14 start moving from the outer side toward the inner side along the axial directions of the screw shafts 11 and 12. Consequently, the decorative rings 5 and 6 that have been stored in the storage spaces S appear in front of the display screen 4a, as illustrated in FIG. 11B. In this case, as illustrated in FIG. 5 to FIG. 7, contact positions at which the guide protrusions 5b and 6b are in contact with the guide rails 9 change from the bent portions 9c to the horizontal portion 9a via the arcuate portions 9b as the actuators 13 and 14 move. Thus, the decorative rings 5 and 6 change their positions from the inclined positions to the horizontal positions by rotating approximately 45 degrees and move closer to each other in front of the display screen 4a while remaining in the horizontal positions.

Figure 3:
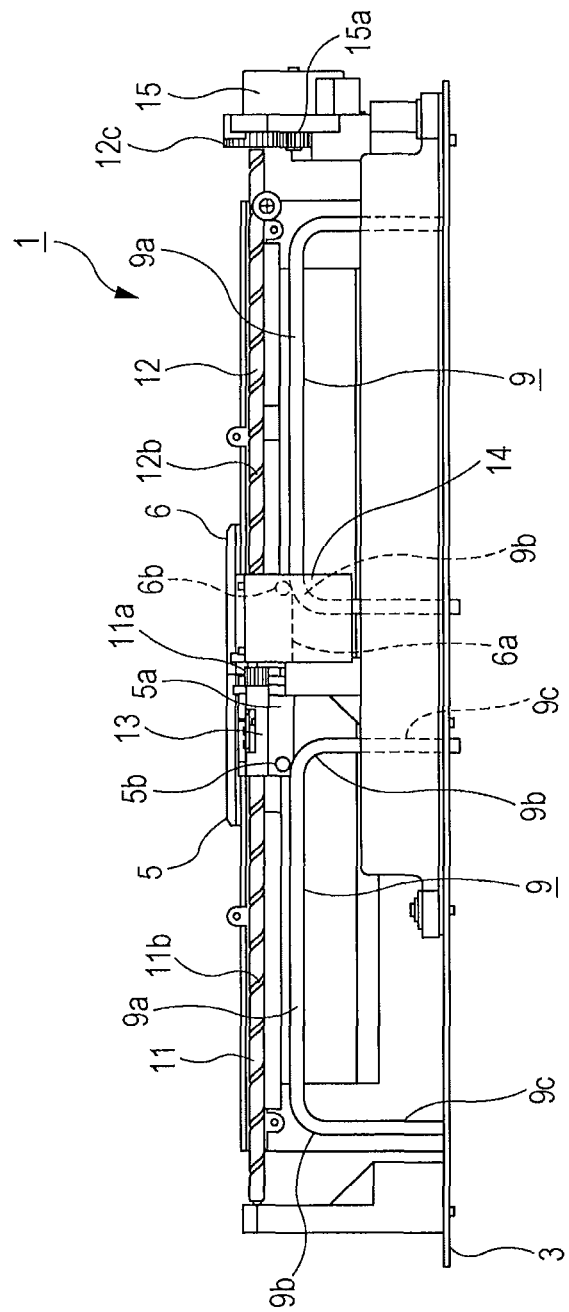
FIG. 3 is a bottom view of the in-vehicle display apparatus illustrated in FIG. 1.

When the decorative rings 5 and 6 arrive at a center portion of the display screen 4a in this manner, the detection switch 16 is turned on by the right actuator 14 and thus the motor 15 temporarily stops in response to an output signal from the detection switch 16. Consequently, the decorative rings 5 and 6 stop in the center portion of the display screen 4a and thus results of system check such as the states of the engine oil or battery are displayed on areas of the display screen 4a outside of the decorative rings 5 and 6 as an initial screen, as illustrated in FIG. 11C. Here, as illustrated in FIG. 2 to FIG. 4, the guide protrusions 5b and 6b are in contact with inner end portions of the horizontal portions 9a of the guide rails 9. Thus, the pair of decorative rings 5 and 6 are joined together in the center portion of the display screen 4a while being in the horizontal positions and form one annular member.

While the vehicle is running or stopped, if the direction in which and the speed at which the motor 15 rotates are controlled with reference to the starting points detected by the detection switch 16 so that the pair of decorative rings 5 and 6 stop at appropriate positions in accordance with contents to be displayed on the display screen 4a, vehicle related information can be stereoscopically and selectively displayed. For example, as illustrated in FIG. 11D, while engine speed and travel speed are displayed on the display screen 4a, if the decorative rings 5 and 6 are stopped at outer peripheral positions of the display areas displaying engine speed and travel speed, the areas of the display screen 4a displaying vehicle related information (such as engine speed or travel speed) can be highlighted by being separated from the surroundings. Alternatively, as illustrated in FIG. 11E, when the display screen 4a is switched to a navigation mode and the decorative rings 5 and 6 are moved to the outside of the display screen 4a and stored in the storage spaces S, the entirety of the display screen 4a can serve as a navigation screen, i.e., full screen display is achieved.

As described above, in the in-vehicle display apparatus 1 according to the embodiment, by moving the decorative rings 5 and 6 obtained by dividing an annular member into two parts toward or away from each other in front of the display panel 4, vehicle related information can be stereoscopically and selectively displayed. For example, a specific type of vehicle related information displayed on the display screen 4a of the display panel 4 is surrounded by the annularly joined decorative rings 5 and 6, or two types of vehicle related information displayed on the display screen 4a are individually and partially surrounded by the corresponding decorative rings 5 and 6. When, for example, the engine (or accessories) is off and the display panel 4 is off, these decorative rings 5 and 6 are rotated on both sides of the display panel 4 in the longitudinal direction and stored in the storage spaces S. Thus, the decorative rings 5 and 6 can be retracted from the front of the display screen 4a that no longer displays images and becomes dark, thereby realizing a stylish design called the "dead front" design, in which the presence of the display panel 4 is not perceived. Furthermore, since the decorative rings 5 and 6 are stored in the storage spaces S while being in inclined positions, the size of the entire in-vehicle display apparatus 1 in the longitudinal direction can be prevented from increasing.

In the embodiment, the driving mechanism 7, which drives the decorative rings 5 and 6 to reciprocate toward and away from each other, includes the motor 15, the first and second screw shafts 11 and 12, which are driven to rotate by the motor 15, and the pair of actuators 13 and 14, which linearly move in the longitudinal direction of the display screen 4a as the screw shafts 11 and 12 rotate. The decorative rings 5 and 6 are rotatably and pivotally supported by the actuators 13 and 14, and the guide protrusions 5b and 6b of the decorative rings 5 and 6 are caused to slide over the guide rails 9 (guide mechanisms). Thus, the angles at which the decorative rings 5 and 6 rotate are regulated and the decorative rings 5 and 6 can operate smoothly. Moreover, since the end portions of the first and second screw shafts 11 and 12 are joined together via the gears in the center portion of the display panel 4 so that the screw shafts 11 and 12 rotate in opposite directions, the pair of decorative rings 5 and 6 can be driven by a single motor 15 to reciprocate toward and away from each other. Thus, the entirety of the driving mechanism 7 can have a simple configuration, leading to space saving.

In this embodiment, the guide rails 9 are used as guide mechanisms that regulate the angles at which the decorative rings 5 and 6 rotate. The guide rails 9 each have the horizontal portion 9a, which extends parallel with the corresponding screw shaft 11 or 12, and the bent portions 9c, which extends from the end of the horizontal portion 9a via the arcuate portion 9b in the direction perpendicular to the horizontal portion 9a. In addition, the guide protrusions 5b and 6b of the decorative rings 5 and 6 are pressed against the guide rails 9 by the urging force of torsion coil springs (spring members). Thus, the guide mechanism can be simply made with this configuration. Guide grooves having a shape similar to the guide rails 9 are also employable as guide mechanisms, and the guide protrusions 5b and 6b may be inserted into the grooves so that the angles at which the decorative rings 5 and 6 rotate are regulated. In this case, spring members may be omitted.

In the first embodiment, by joining the end portions of the first and second screw shafts 11 and 12 together via the gears in the center portion of the display panel 4, the screw shafts 11 and 12 are driven to rotate in opposite directions by a single motor 15. However, the first and second screw shafts 11 and 12 may be individually driven to rotate by separate motors. In this case, if the first and second screw shafts 11 and 12 are disposed so as to extend throughout the entire length of the long side of the display panel 4 while facing each other, the pair of decorative rings 5 and 6 can be made movable from one end to the opposite end of the display screen 4a. Here, the decorative rings 5 and 6 can be annularly joined at any desired position, not only in the center portion of the display screen 4a.

In the first embodiment, the pair of decorative rings 5 and 6, obtained by dividing an annular member into two parts along a line extending in the lateral direction of the display screen 4a, serve as frames, and the decorative rings 5 and 6 are caused to reciprocate toward and away from each other in the longitudinal direction of the display screen 4a. However, a frame may be formed as an integrated annular member that is not divided into two parts. This frame may be caused to reciprocate in the longitudinal direction of the display screen 4a while being in a horizontal position and may be rotated on a side of the display panel 4 in the longitudinal direction of the display panel 4 and stored in a storage space S.

In this case, a driving mechanism that actuates the frame includes a motor, a screw shaft, which is driven to rotate by the motor, and an actuator, which linearly moves in the longitudinal direction of the display screen 4a as the screw shaft rotates. The frame may be rotatably and pivotally supported by the actuator, and a guide mechanism that regulates the angle at which the frame rotates may be provided. The guide mechanism may be a guide rail that includes a horizontal portion, which extends parallel to the screw shaft, and a bent portion, which is continuous with one end of the horizontal portion. The frame may have a guide protrusion that slides over the guide rail. The guide protrusion may be pressed against the guide rail by the urging force of a spring member.

Referring now to FIG. 12 to FIG. 18D, a second embodiment of the present invention will be described. An in-vehicle display apparatus 20 according to the second embodiment mainly includes a base board 21, which is attached to an installation portion of the vehicle, a rectangular display panel 22, which is fixed to the base board 21 and for which a component such as an LCD or an organic EL is employed, first and second decorative rings 23 and 24, which serve as frames, and a pair of driving mechanisms 25, which drive the decorative rings 23 and 24. As in the case of the first embodiment, a display screen 22a of the display panel 22 is visually perceived through an opening of a panel cover, which is not illustrated.

Figure 14:
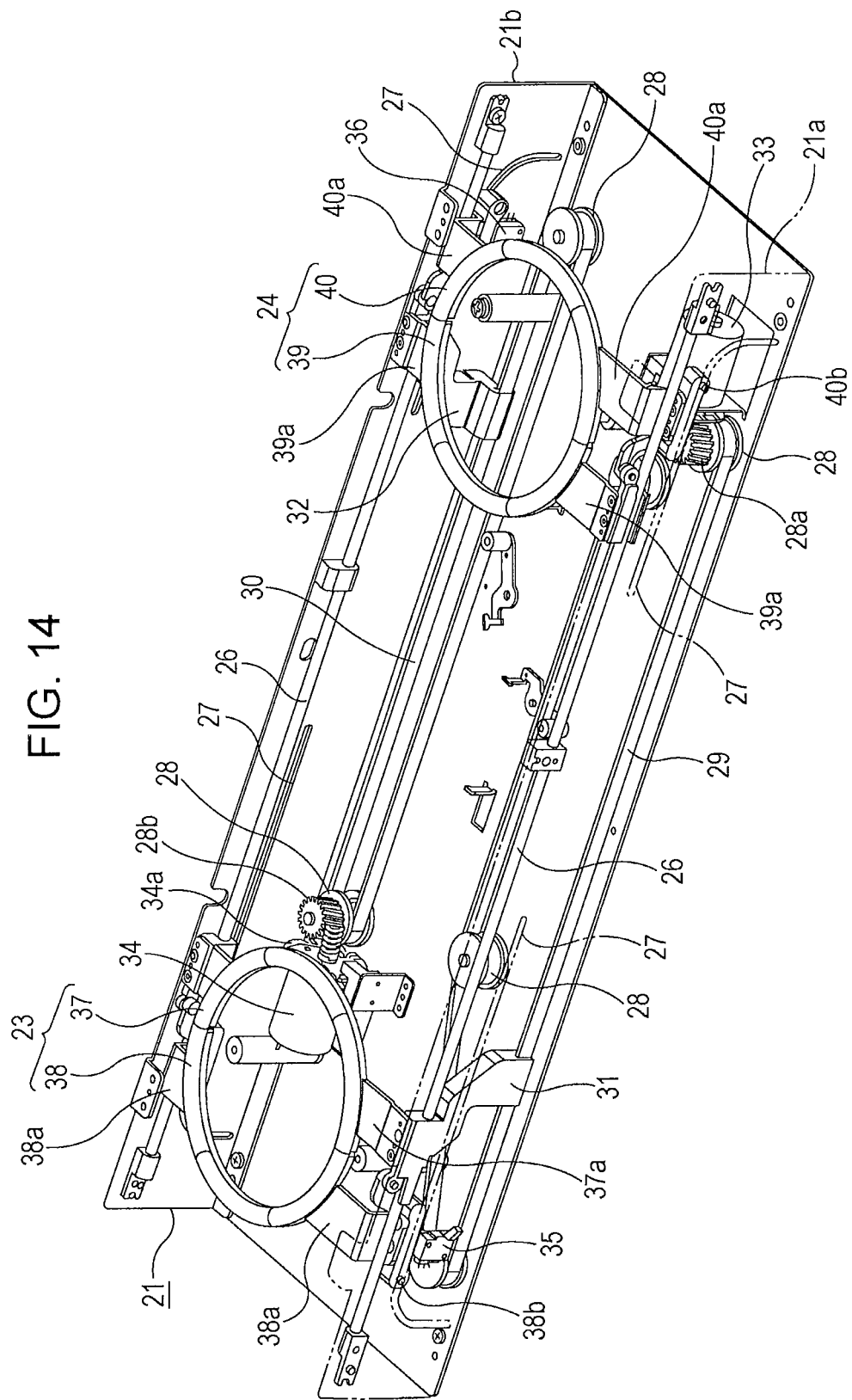
FIG. 14 is a perspective view of the in-vehicle display apparatus from which illustration of the display panel is omitted.

The base board 21 has a pair of erect support walls 21a and 21b. The support walls 21a and 21b are parallel to each other and face each other with the display panel 22 interposed therebetween. In FIG. 14, one of the support walls 21a is drawn by a chain double-dashed line. Guide shafts 26 are fixed to inner surfaces of the support walls 21a and 21b. The guide shafts 26 linearly extend along the long sides of the display panel 22. Each of the support walls 21a and 21b has two guide grooves 27. Each guide groove 27 has a horizontal portion 27a, an arcuate portion 27b, and a bent portion 27c.

The horizontal portion 27a extends in the longitudinal direction (X1-X2 direction of FIG. 12) of the display screen 22a, and the bent portion 27c extends in a direction perpendicular to the horizontal portion 27a from an end portion of the horizontal portion 27a via the arcuate portion 27b.

Six pulleys 28 are pivotally supported by the base board 21. A first timing belt 29 is wound around four of the six pulleys disposed near the lower support wall 21a, and a second timing belt 30 is wound around the remaining two of the six pulleys disposed near the upper support wall 21b. A first actuator 31 is securely fixed to the first timing belt 29. The first actuator 31 is slidably fitted around one of the guide shafts 26. Similarly, a second actuator 32 is securely fixed to the second timing belt 30. The second actuator 32 is slidably fitted around the other guide shaft 26. First and second motors 33 and 34 are mounted on the base board 21. A worm 33a securely fixed to an output shaft of the first motor 33 meshes with a worm wheel 28a attached to a nearby pulley 28. A worm 34a securely fixed to an output shaft of the second motor 34 meshes with a worm wheel 28b attached to a nearby pulley 28. Thus, when the first and second motors 33 and 34 rotate forward or backward, the first and second actuators 31 and 32 linearly move in the axial directions of the corresponding guide shafts 26.

Detection switches 35 and 36 are attached to the inner surfaces of the support walls 21a and 21b. Starting points of the first and second decorative rings 23 and 24 are detected on the basis of output signals from the detection switches 35 and 36. Specifically, the detection switch 35 is positioned within a range in which the first actuator 31 is movable. When the first actuator 31 moves rightward (in the X2 direction) from the left edge of the display screen 22a and becomes separated from the detection switch 35, a contact of the detection switch 35 is subjected to a switching operation so that the detection switch 35 outputs a switch signal. The detection switch 36 is positioned within a range in which the second actuator 32 is movable. When the second actuator 32 moves leftward (in the X1 direction) from the right edge of the display screen 22a and becomes separated from the detection switch 36, a contact of the detection switch 36 is subjected to a switching operation so that the detection switch 36 outputs a switch signal.

The first decorative ring 23 includes two semicircular components obtained by dividing an annular member into two parts along a line extending in the lateral direction (Y1-Y2 direction of FIG. 12) of the display screen 22a, that is, a first movable frame 37, which is a reverse C shaped component disposed on the right side, and a first rotatable frame 38, which is a C shaped component disposed on the left side. The first movable frame 37 includes protrusion pieces 37a that protrude toward the long sides of the display panel 22. One of the protrusion pieces 37a is fixed to the first actuator 31 and the other protrusion piece 37a is slidably fitted around the corresponding guide shaft 26. The first rotatable frame 38 has swing pieces 38a, which are L shaped and protrude toward the long sides of the display panel 22. These swing pieces 38a are rotatably and pivotally supported by the protrusion pieces 37a of the first movable frame 37. Furthermore, each swing piece 38a has an engagement pin 38b, which is slidably inserted into the corresponding guide groove 27 formed in the support wall 21a or 21b.

Thus, when the first timing belt 29 is driven by the first motor 33 to rotate around the pulleys 28 and the first actuator 31 linearly moves in the axial direction of the guide shafts 26 (in the X1-X2 direction of FIG. 12), the first movable frame 37 fixed to the first actuator 31 and the first rotatable frame 38 pivotally supported by the protrusion pieces 37a of the first rotatable frame 37 move together in an integrated manner in front of the display screen 22a. Then, the first rotatable frame 38 changes its orientation in accordance with the positions of the engagement pins 38b with respect to the guide grooves 27 during sliding. Specifically, when the engagement pins 38b slide over the horizontal portions 27a of the guide grooves 27, the first movable frame 37 and the first rotatable frame 38 move in the right-left direction while being in a parallel position in relation to the display screen 22a. When the engagement pins 38b slide over the arcuate portions 27b of the guide grooves 27 toward the bent portions 27c, only the first rotatable frame 38 rotates downward approximately 45 degrees and is stored in a storage space S on a side of the display screen 22a while being in an inclined position.

Similarly, the second decorative ring 24 includes two semicircular components obtained by dividing an annular member into two parts along a line extending in the lateral direction of the display screen 22a, that is, a second movable frame 39, which is a C shaped component disposed on the left side, and a second rotatable frame 40, which is a reverse C shaped component disposed on the right side. The second movable frame 39 includes protrusion pieces 39a that protrude toward the long sides of the display panel 22. One of the protrusion pieces 39a is slidably fitted around the corresponding guide shaft 26 and the other protrusion piece 39a is fixed to the second actuator 32. The second rotatable frame 40 has swing pieces 40a, which are L shaped and protrude toward the long sides of the display panel 22. These swing pieces 40a are rotatably and pivotally supported by the protrusion pieces 39a of the second movable frame 39. Furthermore, each swing piece 40a has an engagement pin 40b, which is slidably inserted into the corresponding guide groove 27 formed in the support wall 21a or 21b.

Thus, when the second timing belt 30 is driven by the second motor 34 to rotate around the pulleys 28 and the second actuator 32 linearly moves in the axial direction of the guide shafts 26, the second movable frame 39 fixed to the second actuator 32 and the second rotatable frame 40 pivotally supported by the protrusion pieces 39a of the second rotatable frame 39 move together in an integrated manner in front of the display screen 22a. Then, the second rotatable frame 40 changes its orientation in accordance with the positions of the engagement pins 40b with respect to the guide grooves 27 during sliding. Specifically, when the engagement pins 40b slide over the horizontal portions 27a of the guide grooves 27, the second movable frame 39 and the second rotatable frame 40 move in the right-left direction while being in a parallel position in relation to the display screen 22a. When the engagement pins 40b slide over the arcuate portions 27b of the guide grooves 27 toward the bent portions 27c, only the second rotatable frame 40 rotates downward approximately 45 degrees and is stored in a storage space S on a side of the display screen 22a while being in an inclined position.

A driving mechanism 25 that drives the first decorative ring 23 includes components such as the first motor 33, the first timing belt 29, the first actuator 31, and the swing pieces 38a. A driving mechanism 25 that drives the second decorative ring 24 includes components such as the second motor 34, the second timing belt 30, the second actuator 32, and the swing pieces 40a. The in-vehicle display apparatus 20 according to the second embodiment includes the first and second decorative rings 23 and 24 as frames that are individually driven by the driving mechanisms 25. Approximately half of the decorative rings 23 and 24 forms movable frames (first and second movable frames 37 and 39) that move while being in parallel positions in relation to the display screen 22a and approximately the other half of the decorative rings 23 and 24 forms rotatable frames (first and second rotatable frames 38 and 40) that are rotatable around the axes extending in the lateral direction of the display screen 22a.

Figure 15:
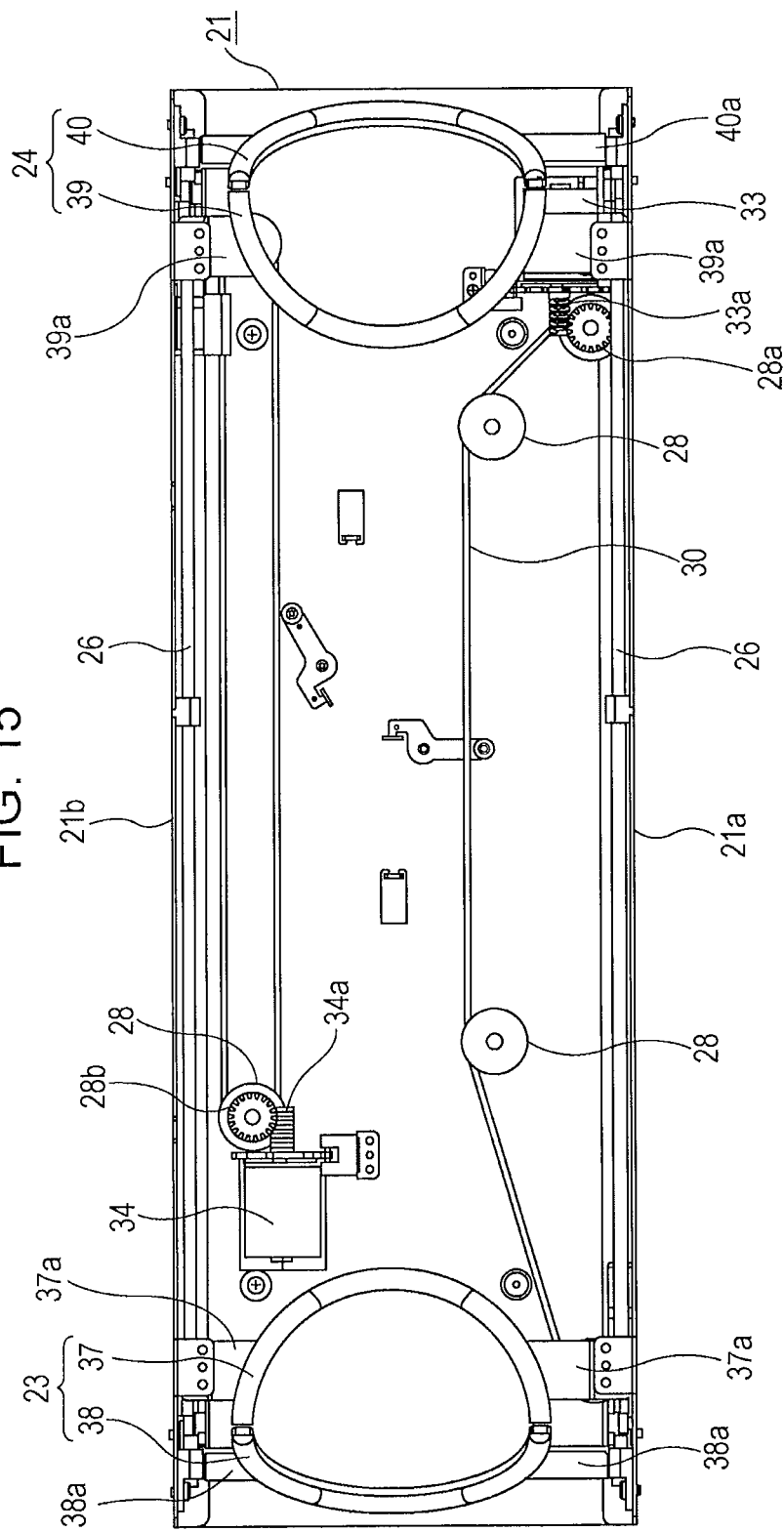
FIG. 15 is a front view of a pair of frames of the in-vehicle display apparatus in a state of being stored in storage spaces.
Figure 16:
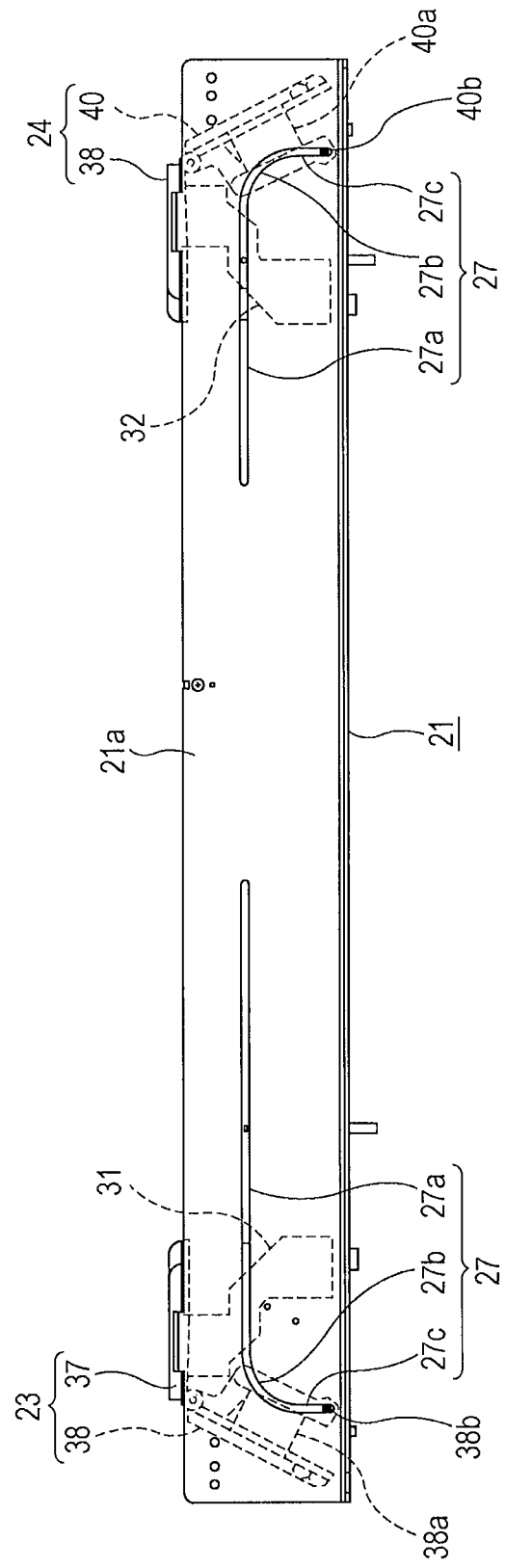
FIG. 16 is a bottom view of the pair of frames in the same state as in FIG. 15.
Figure 17:
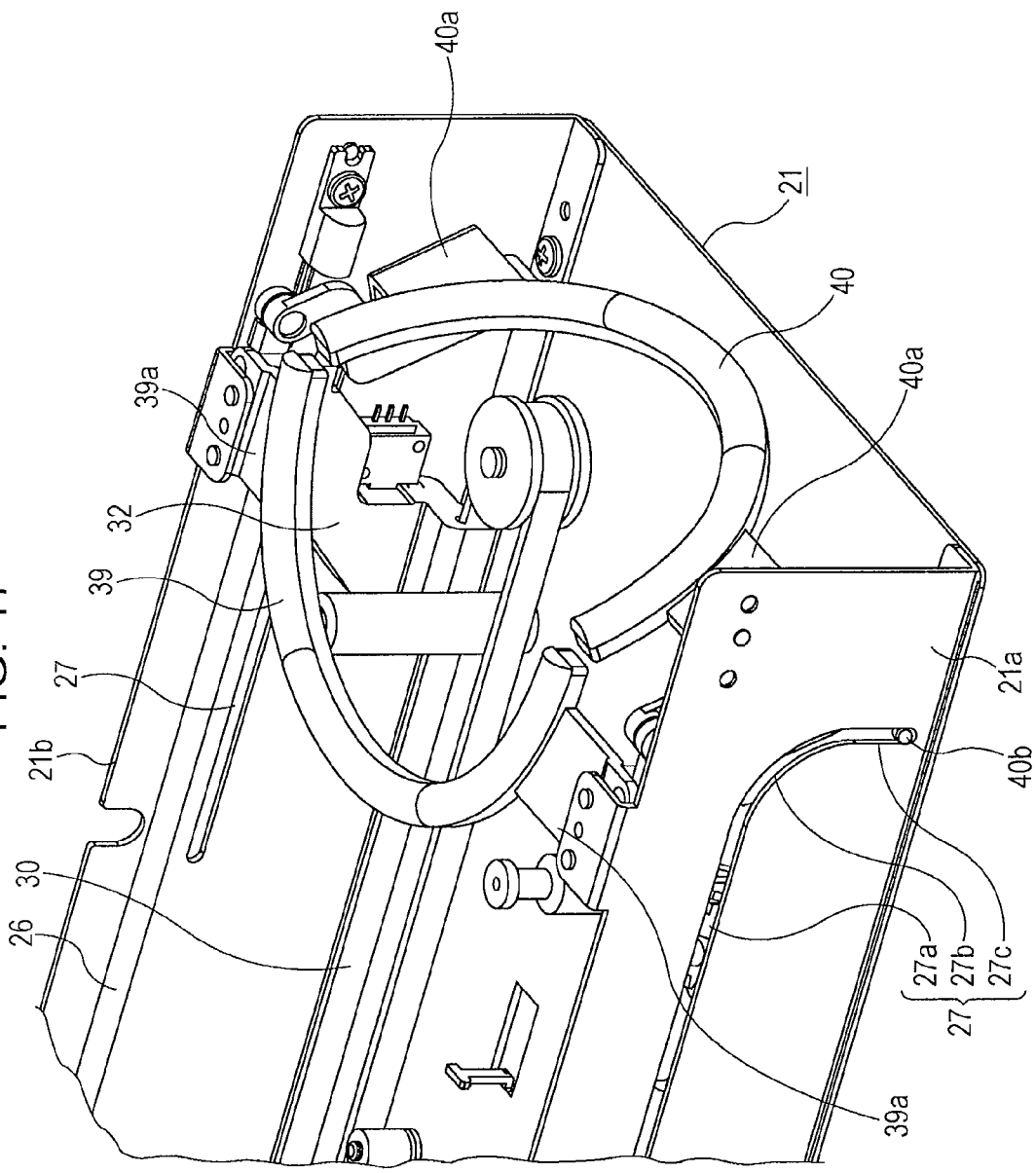
FIG. 17 is a perspective view of a main portion of the pair of frames in the same state as in FIG. 15.
Figure 18A:
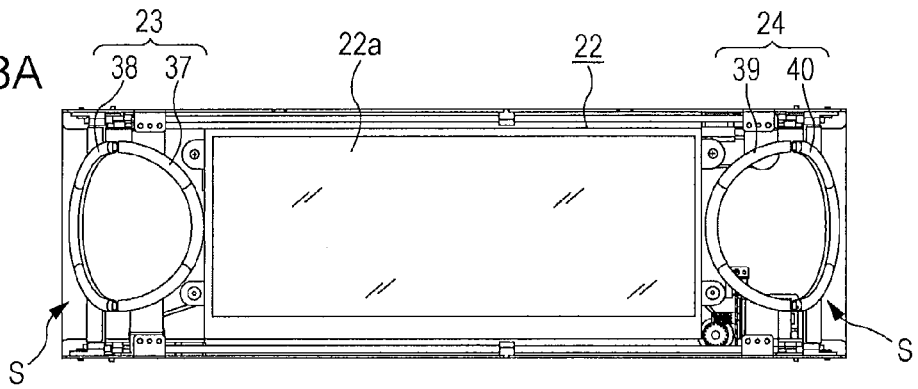
FIGS. 18A to 18D illustrate the positions to which the pair of frames move relative to the display panel.

Referring now to FIGS. 18A to 18D, an operation of the in-vehicle display apparatus 20 according to the second embodiment will be described. When the engine (or accessories) is off, the first and second decorative rings 23 and 24 are retracted from the front of the display screen 22a and are stored in the storage spaces S on both right and left sides of the display panel 22, as illustrated in FIG. 18A. Thus, the "dead front" design, in which the presence of the display panel 22 is not perceived until the power is turned on, is realized. In this case, as illustrated in FIG. 15 to FIG. 17, the first and second movable frames 37 and 39 of the first and second decorative rings 23 and 24 are stored in the storage spaces S while being in the horizontal positions, in which the decorative rings 23 and 24 are parallel to the display screen 22a, whereas the first and second rotatable frames 38 and 40 are stored in the storage spaces S while being in the inclined positions, in which the outer sides of the rotatable frames 38 and 40 are inclined downward, as a result of the engagement pins 38b and 40b being engaged with the lower end portions of the bent portions 27c of the corresponding guide grooves 27. Thus, the dimensions of the storage spaces S in the right-left direction (X1-X2 direction) can be reduced further than in the case where the entireties of the first and second decorative rings 23 and 24 are stored in the storage spaces S while being in the horizontal positions. Accordingly, the size of the entire in-vehicle display apparatus 1 in the longitudinal direction can be reduced.

Figure 18B:
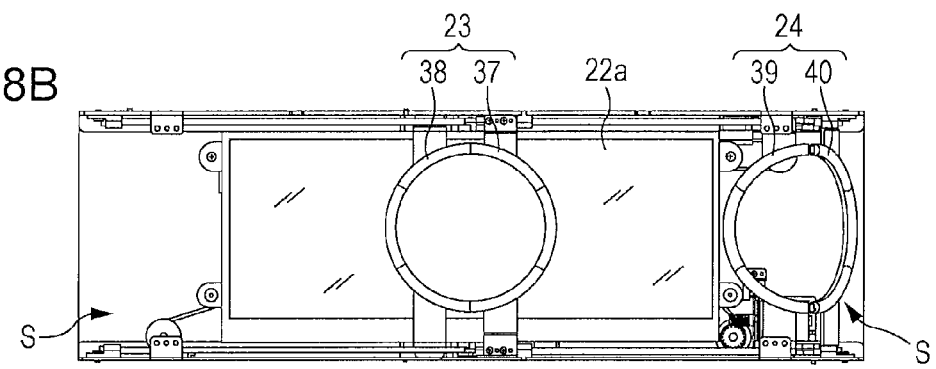

From this state, when the engine (or accessories) is turned on and the in-vehicle display apparatus 20 is turned on, first, the first motor 33 and/or the second motor 34 start rotating forward or backward and then the first actuator 31 and/or the second actuator 32 start moving linearly in the axial direction of the corresponding guide shaft 26. For example, if the first motor 33 starts rotating while the second motor 34 is in a stationary state, the first actuator 31 starts moving from the outer side toward the inner side (in the X2 direction) along the axis of the corresponding guide shaft 26. Consequently, the first decorative ring 23 that has been stored in the left storage space S appears in front of the display screen 22a, as illustrated in FIG. 18B. In this case, the positions at which the engagement pins 38b become engaged with the guide grooves 27 change from the bent portions 27c to the horizontal portions 27a via the arcuate portions 27b as the first actuator 31 moves. Thus, the first rotatable frame 38 changes its position from the inclined position to the horizontal position by rotating approximately 45 degrees and moves together with the first movable frame 37 in front of the display screen 22a while keeping in the horizontal position.

Figure 18C:
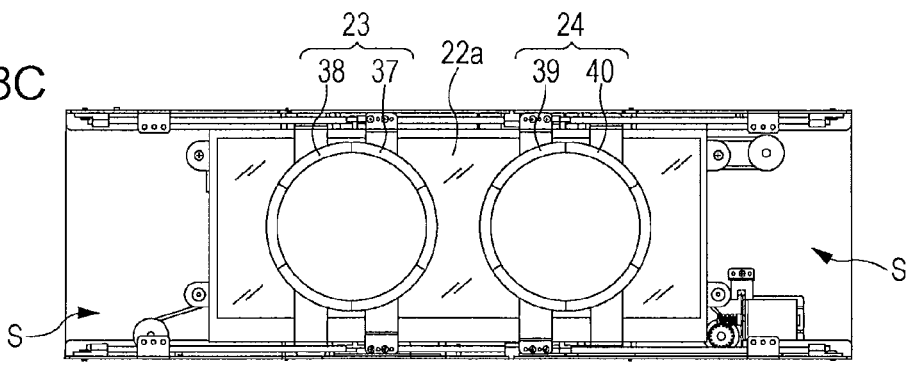

On the other hand, if the second motor 34 starts rotating while the first motor 33 is in a stationary state, the second actuator 33 starts moving from the outer side toward the inner side (in the X1 direction) in the axis direction of the corresponding guide shaft 26. Consequently, the second decorative ring 24 that has been stored in the right storage space S appears in front of the display screen 22a. In this case, the positions at which the engagement pins 40b become engaged with the guide grooves 27 change from the bent portions 27c to the horizontal portions 27a via the arcuate portions 27b as the second actuator 32 moves. Thus, the second rotatable frame 40 changes its position from the inclined position to the horizontal position by rotating approximately 45 degrees and moves together with the second movable frame 39 in front of the display screen 22a while keeping in the horizontal position. Alternatively, if both first and second motors 33 and 34 start rotating, both first and second decorative rings 23 and 24, which have been stored in the right and left storage spaces S, appear in front of the display screen 22a, as illustrated in FIG. 18C.

Figure 18D:
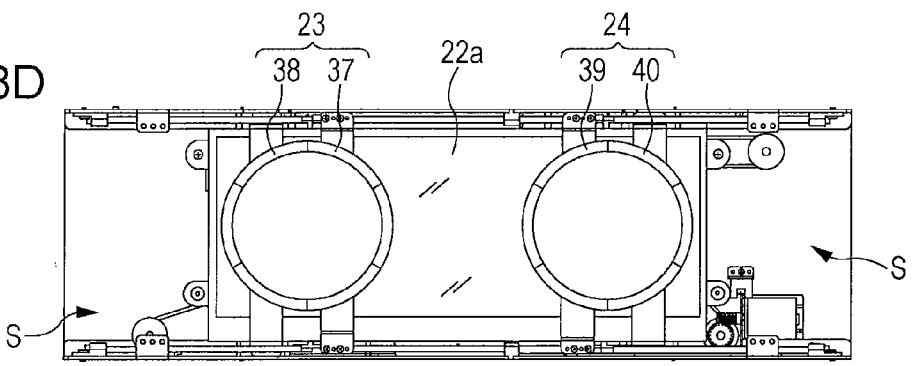

When the first and second actuators 31 and 32 move toward the center portion of the display screen 22a and become separated from the detection switches 35 and 36, on/off switch signals are output from the detection switches 35 and 36 and the starting points of the first and second decorative rings 23 and 24 can be detected on the basis of the switch signals. When the directions in which and the speeds at which the first and second motors 33 and 34 rotate are controlled on the basis of the starting points so that the first and second decorative rings 23 and 24 stop at appropriate positions that correspond to contents displayed on the display screen 22a, vehicle related information can be stereoscopically and selectively displayed. For example, as illustrated in FIG. 18B, the first decorative ring 23 can be stopped at the center portion of the display screen 22a so that results of system check, such as the states of the engine oil or battery, are displayed on the display screen 22a in an area surrounded by the first decorative ring 23 as an initial screen. Alternatively, as illustrated in FIG. 18C, the first and second decorative rings 23 and 24 may be stopped near the center portion of the display screen 22a such that the vehicle related information, such as engine speed or travel speed, may be individually displayed on the display screen 22a in areas surrounded by the first and second decorative rings 23 and 24. Alternatively, as illustrated in FIG. 18D, the first and second decorative rings 23 and 24 may be stopped at right and left positions separated from each other on the display screen 22a so that a different type of vehicle related information is displayed in an area of the display screen 22a interposed between the first decorative ring 23 and the second decorative ring 24. Still alternatively, when the display screen 22a is switched to a navigation mode, by moving the first and second decorative rings 23 and 24 to the outside of the display screen 22a and storing the decorative rings 23 and 24 in the storage spaces S, the entirety of the display screen 22a can be used as, for example, a navigation screen, i.e., full screen display is achieved.

As described above, the in-vehicle display apparatus 20 according to the embodiment can stereoscopically and selectively display vehicle related information by moving the first decorative ring 23 and the second decorative ring 24 in the right-left direction in front of the display panel 22. Specifically, a specific type of vehicle related information displayed on the display screen 22a of the display panel 22 is annularly surrounded by the decorative ring 23 or 24 or two types of vehicle related information displayed on the display screen 22a are individually surrounded by both decorative rings 23 and 24. When, for example, the engine (or accessories) is off and the display panel 22 is off, the first and second decorative rings 23 and 24 are stored in the storage spaces S on both sides of the display panel 22 in the longitudinal direction. Thus, the decorative rings 23 and 24 can be retracted from the front of the display screen 22a that no longer displays images and becomes dark, thereby realizing a stylish design called the "dead front" design, in which the presence of the display panel 22 is not perceived. Furthermore, the first decorative ring 23 includes the semicircular first movable frame 37 and the semicircular first rotatable frame 38, which are joined together such that the first rotatable frame 38 is rotatable with respect to the first movable frame 37, and the second decorative ring 24 includes the semicircular second movable frame 39 and the semicircular second rotatable frame 40, which are joined together such that the second rotatable frame 40 is rotatable with respect to the second movable frame 39. Since the first rotatable frame 38 and the second rotatable frame 40 are stored in the storage spaces S while being in the inclined positions, the dimensions of the entire in-vehicle display apparatus 20 in the longitudinal direction and the thickness direction can be prevented from increasing.

In the embodiment, the driving mechanism 25 for driving the first decorative ring 23 includes the first motor 33, the first timing belt 29, which is driven to rotate by the first motor 33, and the first actuator 31, which is joined to the first timing belt 29 and moves in the axial direction of the guide shafts 26. The first movable frame 37 is securely fixed to the first actuator 31, the first rotatable frame 38 is rotatably joined to the first actuator 31, and the engagement pins 38b of the first rotatable frame 38 are inserted into the guide grooves 27 (guide mechanisms) so that the angle at which the first rotatable frame 38 rotates is regulated. Thus, the first movable frame 37 and the first rotatable frame 38 can operate smoothly. Similarly, the driving mechanism 25 for driving the second decorative ring 24 includes the second motor 34, the second timing belt 30, which is driven to rotate by the second motor 34, and the second actuator 32, which is joined to the second timing belt 30 and moves in the axial direction of the guide shafts 26. The second movable frame 39 is securely fixed to the second actuator 32, the second rotatable frame 40 is rotatably joined to the second actuator 32, and the engagement pins 40b of the second rotatable frame 40 are inserted into the guide grooves 27 (guide mechanisms) so that the angle at which the second rotatable frame 40 rotates is regulated. Thus, the second movable frame 39 and the second rotatable frame 40 can operate smoothly.

In this embodiment, the guide grooves 27 are used as guide mechanisms that regulate the angles at which the first and second rotatable frames 38 and 40 rotate. Each guide groove 27 has the horizontal portion 27a, which extends parallel to the corresponding guide shaft 26, and the bent portion 27c, which extends in the direction perpendicular to the horizontal portion 27a from one end of the horizontal portion 27a via the arcuate portion 27b. The engagement pins 38b and 40b of the swing pieces 38a and 40a of the first and second rotatable frames 38 and 40 are slidably fitted into the guide grooves 27. Thus, the guide mechanism can be made simply with this configuration.

In the second embodiment, the case where two frames, i.e., the first decorative ring 23 and the second decorative ring 24, are used is described. However, either the first decorative ring 23 or the second decorative ring 24 may be omitted and only one frame may be moved in the right-left direction in front of the display panel 22.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:
1. An in-vehicle display apparatus comprising:
 a display panel including an elongated display screen;
 a frame positioned in front of the display panel, the frame surrounding at least part of an outer periphery of an image displayed on the display panel; and a driving mechanism that drives the frame to reciprocate in a longitudinal direction of the display screen, wherein at least part of the frame forms a rotatable frame that is rotatable around an axis extending in a lateral direction of the display screen, wherein the driving mechanism moves the frame while the frame is in front of the display panel and in a parallel position in relation to the display screen, and wherein the rotatable frame is rotated on a side of the display panel in a longitudinal direction of the display panel and stored in a storage space.

2. The in-vehicle display apparatus according to claim 1, wherein the driving mechanism includes a motor, a screw shaft that is driven to rotate by the motor, and an actuator that linearly moves in the longitudinal direction of the display screen as the screw shaft rotates, and wherein the actuator includes a guide mechanism that rotatably and pivotally supports the rotatable frame and that regulates an angle at which the rotatable frame rotates.

3. The in-vehicle display apparatus according to claim 2, wherein the guide mechanism includes a guide rail including a horizontal portion that extends parallel to the screw shaft and a bent portion that is continuous with an end of the horizontal portion, and wherein the rotatable frame includes a guide protrusion that slides over the guide rail and the guide protrusion is pressed against the guide rail by an urging force of a spring member.

4. The in-vehicle display apparatus according to claim 1, wherein the driving mechanism includes a motor, a timing belt driven by the motor to rotate between a pair of pulleys, and an actuator joined to the timing belt, the actuator moving along a guide shaft that extends in a longitudinal direction of the display screen, wherein the actuator rotatably and pivotally supports the rotatable frame, and wherein a guide mechanism is provided to regulate an angle at which the rotatable frame rotates.

5. The in-vehicle display apparatus according to claim 4, wherein the guide mechanism includes a guide groove including a horizontal portion that extends parallel to the guide shaft and a bent portion that is continuous with an end of the horizontal portion, and wherein the rotatable frame includes a guide protrusion that fits into the guide groove.

6. The in-vehicle display apparatus according to claim 1, wherein the frame includes a pair of semicircular decorative rings obtained by dividing an annular member into two parts along a line extending in the lateral direction of the display screen, the decorative rings being individually rotatable around axes extending in the lateral direction of the display screen, wherein the driving mechanism drives the pair of decorative rings to reciprocate toward and away from each other in the longitudinal direction of the display screen, and wherein the driving mechanism drives the decorative rings to rotate on both sides of the display panel in the longitudinal direction and stores the decorative rings in storage spaces.

7. The in-vehicle display apparatus according to claim 6, wherein the driving mechanism includes a motor, a pair of screw shafts driven to rotate by the motor, and a pair of actuators that linearly move in the longitudinal direction of the display screen as the screw shafts rotate, wherein the decorative rings are rotatably and pivotally supported by the actuators, and wherein a guide mechanism is provided to regulate angles at which the decorative rings rotate.

8. The in-vehicle display apparatus according to claim 7, wherein the pair of screw shafts are joined together via a gear in a center portion of the display panel in the longitudinal direction of the display panel so as to rotate in opposite directions.

9. The in-vehicle display apparatus according to claim 7, wherein the guide mechanism includes a guide rail including a horizontal portion that extends parallel to the screw shafts and a bent portion that is continuous with an end of the horizontal portion, and wherein each of the decorative rings includes a guide protrusion that slides over the guide rail and the guide protrusion is pressed against the guide rail by an urging force of a spring member.

10. The in-vehicle display apparatus according to claim 1, wherein the frame includes a pair of semicircular members obtained by dividing an annular member into two parts along a line extending in the lateral direction of the display screen, one of the semicircular members is a movable frame that moves while being in a parallel position in relation to the display screen, and the other semicircular member is the rotatable frame rotatably and pivotally supported by the movable frame, wherein the driving mechanism drives the movable frame and the rotatable frame to reciprocate in the longitudinal direction of the display screen while the movable frame and the rotatable frame are annularly joined, and wherein the rotatable frame is rotated on a side of the display panel in the longitudinal direction of the display panel and stored in the storage space.

11. The in-vehicle display apparatus according to claim 10, wherein the driving mechanism includes a motor, a timing belt driven by the motor to rotate, and an actuator joined to the timing belt, the actuator moving along a guide shaft that extends in a longitudinal direction of the display screen, wherein the movable frame is securely fixed to the actuator and the rotatable frame is rotatably joined to the actuator, and wherein a guide mechanism is provided to regulate an angle at which the rotatable frame rotates.

12. The in-vehicle display apparatus according to claim 11, wherein the guide mechanism includes a guide groove including a horizontal portion that extends parallel to the guide shaft and a bent portion that is continuous with an end of the horizontal portion, and wherein the rotatable frame includes an engagement protrusion that fits into the guide groove.

13. An in-vehicle display apparatus comprising:

a display panel including a rectangular display screen;

a frame positioned in front of the display panel, the frame surrounding at least part of an outer periphery of an image displayed on the display panel; and a driving mechanism that drives the frame to reciprocate in a longitudinal direction of the display screen, wherein the frame includes a pair of semicircular decorative rings obtained by dividing an annular member into two parts along a line extending in a lateral direction of the display screen, the decorative rings being individually rotatable around axes extending in the lateral direction of the display screen, wherein the driving mechanism drives the decorative rings to reciprocate toward and away from each other in the longitudinal direction of the display screen while the decorative rings are in front of the display panel and are parallel to the display screen, and wherein the decorative rings are rotated on sides of the display panel in a longitudinal direction of the display panel and stored in storage spaces.

14. The in-vehicle display apparatus according to claim 13, wherein the driving mechanism includes a motor, a pair of screw shafts driven to rotate by the motor, and a pair of actuators that linearly move in the longitudinal direction of the display screen as the screw shafts rotate, wherein the decorative rings are rotatably and pivotally supported by the actuators, and wherein a guide mechanism is provided to regulate angles at which the decorative rings rotate.

15. The in-vehicle display apparatus according to claim 14, wherein the pair of screw shafts are joined together via a gear in a center portion of the display panel in the longitudinal direction of the display panel so as to rotate in opposite directions.

16. The in-vehicle display apparatus according to claim 14, wherein the guide mechanism includes a guide rail including a horizontal portion that extends parallel to the screw shaft and a bent portion that is continuous with an end of the horizontal portion, and wherein each of the decorative rings includes a guide protrusion that slides over the guide rail and the guide protrusion is pressed against the guide rail by an urging force of a spring member.

17. An in-vehicle display apparatus comprising:
a display panel including an elongated display screen;
a frame positioned in front of the display panel, the frame surrounding at least part of an outer periphery of an image displayed on the display panel; and
a driving mechanism that drives the frame to reciprocate in a longitudinal direction of the display screen, wherein the frame includes a pair of semicircular members obtained by dividing an annular member into two parts along a line extending in a lateral direction of the display screen, one of the semicircular members forms a movable frame that moves while being in a parallel position in relation to the display screen, and the other semicircular member forms a rotatable frame rotatably and pivotally supported by the movable frame, wherein the driving mechanism drives the movable frame and the rotatable frame to reciprocate in the longitudinal direction of the display screen in front of the display panel while the movable frame and the rotatable frame are annularly joined, and wherein the rotatable frame is rotated on a side of the display panel in the longitudinal direction of the display panel and stored in a storage space.

18. The in-vehicle display apparatus according to claim 17, wherein the driving mechanism includes a motor, a timing belt driven by the motor to rotate, and an actuator joined to the timing belt, the actuator moving along a guide shaft that extends in the longitudinal direction of the display screen, wherein the movable frame is securely fixed to the actuator and the rotatable frame is rotatably joined to the actuator, and wherein a guide mechanism is provided to regulate an angle at which the rotatable frame rotates.

19. The in-vehicle display apparatus according to claim 18, wherein the guide mechanism includes a guide groove including a horizontal portion that extends parallel to the guide shaft and a bent portion that is continuous with an end of the horizontal portion, and wherein the rotatable frame includes an engagement protrusion that fits into the guide groove.

* * * * *